United States Patent
Everts et al.

(10) Patent No.: US 10,627,724 B2
(45) Date of Patent: Apr. 21, 2020

(54) LITHOGRAPHIC APPARATUS AND METHOD

(71) Applicants: ASML Netherlands B.V., Veldhoven (NL); Cymer, LLC, San Diego, CA (US)

(72) Inventors: Frank Everts, Eindhoven (NL); Wilhelmus Patrick Elisabeth Maria Op 't Root, Nederweert (NL); Herman Philip Godfried, Amsterdam (NL); Joshua Jon Thornes, San Diego, CA (US); Kevin Michael O'Brien, San Diego, CA (US); Leon Pieter Paul Saanen, Eindhoven (NL); Tanuj Aggarwal, San Diego, CA (US)

(73) Assignees: ASML Netherlands B.V., Veldhoven (NL); CYMER, LLC, San Diego, CA (US)

( * ) Notice: Subject to any disclaimer, the term of this patent is extended or adjusted under 35 U.S.C. 154(b) by 113 days.

(21) Appl. No.: 15/759,358

(22) PCT Filed: Aug. 23, 2016

(86) PCT No.: PCT/EP2016/069879
§ 371 (c)(1),
(2) Date: Mar. 12, 2018

(87) PCT Pub. No.: WO2017/050506
PCT Pub. Date: Mar. 30, 2017

(65) Prior Publication Data
US 2018/0253014 A1 Sep. 6, 2018

Related U.S. Application Data

(60) Provisional application No. 62/222,610, filed on Sep. 23, 2015.

(51) Int. Cl.
*G03B 27/54* (2006.01)
*G03F 7/20* (2006.01)

(52) U.S. Cl.
CPC ...... *G03F 7/70558* (2013.01); *G03F 7/70008* (2013.01); *G03F 7/70066* (2013.01); *G03F 7/70525* (2013.01); *G03F 7/70533* (2013.01)

(58) Field of Classification Search
CPC ............ G03F 7/70558; G03F 7/70008; G03F 7/70066; G03F 7/70525; G03F 7/70716;
(Continued)

(56) References Cited

U.S. PATENT DOCUMENTS 6,067,306 A    5/2000  Sandstrom et al.
6,418,155 B1 * 7/2002  Wakabayashi .......... H01S 3/131
                                          372/29.021

(Continued)

FOREIGN PATENT DOCUMENTS

CN    101163366    4/2008
JP    62-51280     3/1987
(Continued)

OTHER PUBLICATIONS

English translation of WO2013/147052, published Oct. 3, 2013. (Year: 2013).*

(Continued)

*Primary Examiner* — Christina A Riddle
(74) *Attorney, Agent, or Firm* — Pillsbury Winthrop Shaw Pittman LLP

(57) ABSTRACT

A method of controlling output of a radiation source, the method including: periodically monitoring an output energy of the radiation source; determining a difference between a reference energy signal and the monitored output energy; determining a feedback value; determining a desired output energy of the radiation source for a subsequent time period;

(Continued)

and controlling an input parameter of the radiation source in dependence on the determined desired output energy during the subsequent time period. If the magnitude of the determined difference between the monitored output energy of the radiation source and the reference energy signal exceeds a threshold value: the determined difference does not contribute to the feedback value; and the determined difference is spread over the subsequent time period according to a reference energy signal adjustment profile and the reference energy signal adjustment profile is added to the reference energy signal for the subsequent time period.

20 Claims, 9 Drawing Sheets

(58) Field of Classification Search
CPC ............ G03F 7/70516; G03F 7/70533; G03F 7/70625; G03F 7/70025; G03F 7/705; G03F 7/70016; G03F 7/70033; G03F 7/70041
USPC ......... 355/52, 53, 55, 67–71, 77; 250/492.1, 250/492.2, 492.22, 492.23, 493.1, 503.1, 250/505.1; 372/29.01, 29.011, 29.014, 372/29.02, 29.021, 38.1, 38.01, 38.02, 55, 372/57
See application file for complete search history.

(56) References Cited

U.S. PATENT DOCUMENTS

| | | |
|---|---|---|
| 7,057,705 B2 | 6/2006 | Heintze |
| 7,061,591 B2 | 6/2006 | Bleeker et al. |
| 7,868,999 B2 | 1/2011 | Heintze et al. |
| 2004/0021840 A1 | 2/2004 | Heintze |
| 2004/0239908 A1 | 12/2004 | Bleeker et al. |
| 2004/0258112 A1* | 12/2004 | Furumiya ............ G11B 7/1263 372/38.01 |
| 2007/0008861 A1 | 1/2007 | Fumanti |
| 2008/0036991 A1 | 2/2008 | Heintze et al. |

FOREIGN PATENT DOCUMENTS

| | | |
|---|---|---|
| JP | 2013-207251 | 10/2013 |
| WO | 99/19950 | 4/1999 |
| WO | 2006/029858 | 3/2006 |
| WO | 2013/147052 | 10/2013 |

OTHER PUBLICATIONS

International Search Report and Written Opinion dated Dec. 16, 2016 in corresponding International Patent Application No. PCT/EP2016/069879.

Taiwan Office Action dated Sep. 27, 2017 in corresponding Taiwan Patent Application No. 105130553.

* cited by examiner

LITHOGRAPHIC APPARATUS AND METHOD

CROSS-REFERENCE TO RELATED APPLICATIONS

This application is the U.S. national phase entry of PCT patent application no. PCT/EP2016/069879, which was filed on Aug. 23, 2016, which claims the benefit of priority of U.S. provisional patent application No. 62/222,610, which was filed on Sep. 23, 2015 and which is incorporated herein in its entirety by reference.

FIELD

The present description relates to a method and associated apparatus for controlling the output of a radiation source. The method and apparatus may be used by a lithographic apparatus and may provide increased control over dose variations.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called scanners, in which each target portion is irradiated by scanning the pattern through the beam in a given direction (the "scanning"-direction) while synchronously scanning the substrate parallel or anti parallel to this direction and so-called steppers, in which each target portion is irradiated by exposing an entire pattern onto the target portion in one go.

SUMMARY

It is desirable to provide a lithographic apparatus that allows one to accurately control the dose of radiation received by each point on the target portion of the substrate. The dose of radiation received by a part of the target area of the substrate may be defined as the amount of energy per unit area which is received by that part. Accurate control of the dose of radiation in turn allows variation of the critical dimension of features formed on the substrate to be controlled. One potential source of dose variation is the output power or energy of a radiation source that supplies the lithographic apparatus with radiation.

It is desirable, for example, to provide a method of controlling the output of a radiation source lithographic apparatus and a device manufacturing method that at least partially addresses one or more of the problems of the art, whether identified herein or elsewhere.

According to an aspect, there is provided a method of controlling the output of a radiation source, the method comprising: periodically monitoring an output energy of the radiation source; determining a difference between a reference energy signal and the monitored output energy of the radiation source; determining a feedback value, the feedback value being dependent on the determined difference between the reference energy signal and the monitored output energy for a preceding time period; determining a desired output energy of the radiation source for a subsequent time period, the desired output energy being a combination of the reference energy signal and the feedback value; and controlling one or more input parameters of the radiation source in dependence on the determined desired output energy during the subsequent time period; wherein in the event that the magnitude of the determined difference between the monitored output energy of the radiation source and the reference energy signal exceeds a threshold value: the determined difference between the monitored energy of the radiation source and the reference energy signal does not contribute to the feedback value, and the method further comprises spreading the determined difference between the monitored energy of the radiation source and the reference energy signal over the subsequent time period according to a reference energy signal adjustment profile and altering the reference energy signal for the subsequent time period such that the reference energy signal adjustment profile is added to the reference energy signal for the subsequent time period.

This aspect relates to a novel method of controlling the output of a radiation source that is less sensitive to large fluctuations in output energy of the radiation source. To achieve this, the dynamic response of the control feedback loop is different for large variations in energy. That is, the method comprises at least two separate modes of operation. A first mode is for normal operation where the variation in output energy of the radiation source is relatively small (i.e. the magnitude of the determined difference between the monitored energy of the radiation source and the reference energy signal is less than a threshold value). A second mode is for operation in response to the detection of an energy which deviates significantly from a desired energy (i.e. the magnitude of the determined difference between the monitored energy of the radiation source and the reference energy signal is greater than the threshold value). In response to the detection of an output energy which deviates significantly from the desired energy (i.e. the magnitude of the difference between the monitored energy of the radiation source and the reference energy signal exceeds the threshold value) the method automatically switches from operation in the first mode to operation in the second mode.

In the second mode, the difference between the monitored energy of the radiation source and the reference energy does not contribute to the feedback value. This prevents the feedback loop from reacting aggressively to the large determined difference. Such an aggressive response may result in desired values for one or more input parameters of the radiation source that lie outside of their operational ranges, which may result in undesired unstable behavior of the control loop.

In addition, in the second mode, the reference energy signal is altered for the subsequent time period in the following way. The difference between the reference energy signal and the monitored energy of the radiation source is added to the reference energy signal for the subsequent time period, spread over the subsequent time period according to a reference energy signal adjustment profile. Therefore, although the determined difference between the monitored energy of the radiation source and the reference energy signal does not contribute to the feedback value, it is not discarded but is compensated for during the subsequent time period so as to reduce the impact of any relatively large dips in output energy on dose performance.

Therefore, in the event of a relatively large dip in output energy (for example a so called drop out pulse): (a) the dose error is significantly reduced; and (b) the stability of the control loop is increased, while maintaining high performance in the nominal situation (i.e. allowing an aggressive feedback response in the first mode).

For embodiments wherein the radiation source is a pulsed radiation source, a fraction of the determined difference which exceeded the threshold value is added to the reference energy signal for each of one or more subsequent pulses such that the sum of the fractions is equal to the total determined difference. Alternatively, for embodiments wherein the radiation source is a continuous radiation source, the reference energy signal adjustment profile added to the reference energy signal for the subsequent time period is such that the time integral of the profile over the subsequent time period is equal to the total determined difference.

The desired output energy may be a linear combination of the reference energy signal and the feedback value. In some embodiments, the desired output energy may be a sum of the reference energy signal and the feedback value. In other embodiments, the reference energy signal may be multiplied by a constant of proportionality such that the desired output energy may be a sum of the feedback value and the reference energy signal multiplied by the constant of proportionality.

The magnitude of a determined difference between two quantities may alternatively be referred to as the absolute value of the determined difference between the two quantities and is positive.

The length of the subsequent time period over which the determined difference between the monitored energy of the radiation source and the reference energy signal is added to the reference energy may be dependent on the magnitude of the determined difference between the monitored energy of the radiation source and the reference energy signal, which is also named the magnitude of a drop out error.

A shape of the reference energy signal adjustment profile may be dependent on the magnitude of the determined difference between the monitored energy of the radiation source and the reference energy signal.

The reference energy signal adjustment profile may be a constant profile such that the determined difference between the monitored energy of the radiation source and the reference energy signal is spread evenly over the subsequent time period. For embodiments wherein the radiation source is a pulsed radiation source, a constant reference energy signal adjustment profile is one for which the determined difference between the monitored energy of the radiation source and the reference energy signal is spread evenly over one or more subsequent pulses. An advantage of a constant profile is that the risk of generating a value of one or more parameters of the radiation source that lies outside of its allowed performance range can be minimized. However, a constant profile may not be optimal for dose performance (i.e. for minimizing dose variation).

The reference energy signal adjustment profile may be a linear profile such that a fraction of the determined difference between the monitored energy of the radiation source and the reference energy signal that is added to the reference energy signal decreases linearly with time during the subsequent time period. Advantageously, with such a linear profile a relatively large difference can be mitigated more quickly (than with a constant profile). Another advantage of a linear profile is that the reference energy signal goes gradually back to the nominal reference energy signal. However, in order to compensate for a given determined difference using the linear profile in a given subsequent time period the difference between the reference energy signal and a nominal reference energy signal at the start of the subsequent time period should be greater than when using a constant profile. This increases the risk of generating a value of one or more parameters of the radiation source that lies outside of its allowed performance range.

The reference energy signal adjustment profile may be a maximized constant profile wherein the reference energy signal is increased to a maximum value for a first portion of the subsequent time period and decreases to a smaller value for a second portion of the subsequent time period. For embodiments wherein the radiation source is a pulsed radiation source, a maximized constant profile may be one for which the reference energy signal is increased to a maximum value for all pulses during the subsequent time period except for the last such pulse. The reference energy signal for the last pulse is increased by a sufficient amount (in general less than the maximum value) to ensure that the determined difference is corrected for.

For the maximized constant profile, the maximum value of the reference energy signal may correspond to a maximum value of the one or more parameters of the radiation source that lies within its allowed performance range. In practice, the maximum value of the reference energy signal may be chosen to be smaller than the value that corresponds to a maximum value of the one or more parameters that lies within its allowed performance range to allow the energy of the subsequent pulses to oscillate about the maximum value without risking generation of a value of the one or more parameters that lies outside of the allowed performance range.

The maximized constant profile allows for the determined difference to be compensated for more quickly than with a constant profile although the risk of generating a value of one or more parameters of the radiation source that lies outside of its allowed performance range is increased.

The threshold value may be dependent upon an allowed operational range of the one or more input parameters of the radiation source.

The threshold value may be chosen such that if a determined difference between the monitored energy of the radiation source and the reference energy signal would give rise to a value of one or the one or more input parameters of the radiation source lying outside of its operational range then the magnitude of the determined difference between the monitored energy of the radiation source and the reference energy signal will exceed the threshold value. The threshold value may also be dependent upon a typical amplitude of noise on a signal indicative of the monitored energy of the radiation source.

The threshold value may be chosen such that if a determined difference between the monitored energy of the radiation source and the reference energy signal is less than a typical amplitude of noise on a signal indicative of the monitored energy of the radiation source then the magnitude of the determined difference between the monitored energy of the radiation source and the reference energy signal will not exceed the threshold value.

The threshold value may be 25% of the reference energy. Alternatively, the threshold value may be 50% of the reference energy. Alternatively, the threshold value may be 75% of the reference energy.

The feedback value may be determined such that the desired energy for the subsequent time period at least partially compensates for a difference between the reference energy and the monitored energy over the preceding time period.

The feedback value may be determined using any of the following: proportional feedback, integral feedback, differential feedback, or any combination selected from these. It will be appreciated that additional or alternative types of feedback control may be used. An embodiment of the method is particularly applicable to very aggressive control loops. It will be appreciated that in here an aggressive control loop is a control loop with a fast response and which attempts to reduce errors quickly, i.e. over a relatively small time period.

The radiation source may be a pulsed radiation source. For such a pulsed radiation source, periodically monitoring an energy of the radiation source may comprise monitoring an energy of each pulse, or a repeated plurality of pulses, of the radiation source.

Controlling one or more input parameters of the radiation source in dependence on the determined desired energy during the subsequent time period may comprise: calculating values for one or more input parameters of the radiation source using a relationship, and controlling the radiation source using the calculated one or more input parameters. The relationship may comprise one or more relationship parameters that may be determined during a calibration process or method.

The radiation source may be a gas laser comprising a pair of discharge conductors across which a voltage is applied. The one or more input parameters of the radiation source may comprise the voltage applied across the pair of discharge conductors. Within an operational range, the relationship between the energy of the radiation source and the voltage applied across the conductors may be approximated by a linear relationship and the one or more relationship parameters may comprise an offset and a gain.

Controlling one or more input parameters of the radiation source in dependence on the determined desired energy during the subsequent time period may further comprise limiting the one or more parameters to an allowed operational range. If the calculated values for the one or more parameters lie within an allowed operational range of the radiation source, the calculated values of the one or more parameters are used to control the radiation source. However, if the calculated value for any of the one or more parameters, or a rate of change of any of the one or more parameters, lies outside an operational range of the radiation source, the values of the one or more parameters may be altered such that they do lie within the allowed operational range and the altered values are used to control the radiation source. This helps ensure that the one or more parameters and/or their rates of change are within an allowed performance range of the radiation source. The one or more parameters and/or their rates of change may be limited to allowed performance ranges to help ensure the performance of the radiation source (for example, the dose delivered to the substrate and the wavelength and bandwidth of the radiation) is acceptable.

According to a further aspect, there is provided a method of controlling the output of a radiation source, the method comprising: periodically monitoring an energy of the radiation source; determining a difference between a reference energy signal and the monitored energy of the radiation source; determining a desired energy of the radiation source for a subsequent time period; and controlling one or more input parameters of the radiation source in dependence on the determined desired energy during the subsequent time period; wherein the determination of the desired energy is dependent on the magnitude of the determined difference between the monitored energy of the radiation source and the reference energy signal, such that if the determined difference between the monitored energy of the radiation source and the reference energy signal is less than a threshold value the determination of the desired energy is according to a first operational mode and if the determined difference between the monitored energy of the radiation source and the reference energy signal is greater than a threshold value the determination of the desired energy is according to a second operational mode.

According to a further aspect, there is provided a lithography method comprising: providing a radiation beam using a radiation source; using a patterning device to impart the radiation beam with a pattern in its cross-section; and projecting the patterned radiation beam onto a target portion of a substrate; wherein an output power of the radiation source is controlled using a method as described herein.

The power of the radiation beam may be controlled so as to help ensure that one or more parts of the target portion receive a desired dose of radiation.

According to a further aspect, there is provided a control system for a radiation source, the control system comprising: a radiation sensor operable to periodically determine an energy of the radiation source and output a signal indicative thereof; and a controller operable to: receive the signal; determine a difference between a reference energy signal and the energy of the radiation source; determine a feedback value, the feedback value being dependent on the determined difference between the reference energy signal and the determined energy for a preceding time period; determine a desired energy of the radiation source for a subsequent time period, the desired energy being a sum of the reference energy signal and the feedback value; and determine a value of one or more input parameters of the radiation source in dependence on the determined desired energy during the subsequent time period; wherein in the event that the magnitude of the determined difference between the energy of the radiation source and the reference energy signal exceeds a threshold value: the determined difference between the monitored energy of the radiation source and the reference energy signal does not contribute to the feedback value, and the controller is further operable to alter the reference energy for the subsequent time period such that the determined difference between the monitored energy of the radiation source and the reference energy signal is added to the reference energy for the subsequent time period, spread over the subsequent time period according to a reference energy signal adjustment profile.

The controller may be operable to implement a method as described herein.

According to a further aspect, there is provided a lithographic system comprising: a radiation source operable to output a radiation beam; an illumination system configured to condition the radiation beam; a substrate table configured to hold a substrate such that a target portion of the substrate is arranged to receive the radiation beam; a projection system configured to project the radiation beam onto the substrate; and a control system as described herein.

According to a further aspect, there is provided a computer program operable to implement a method as described herein.

Various aspects and features set out above or below may be combined with various other aspects and features as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
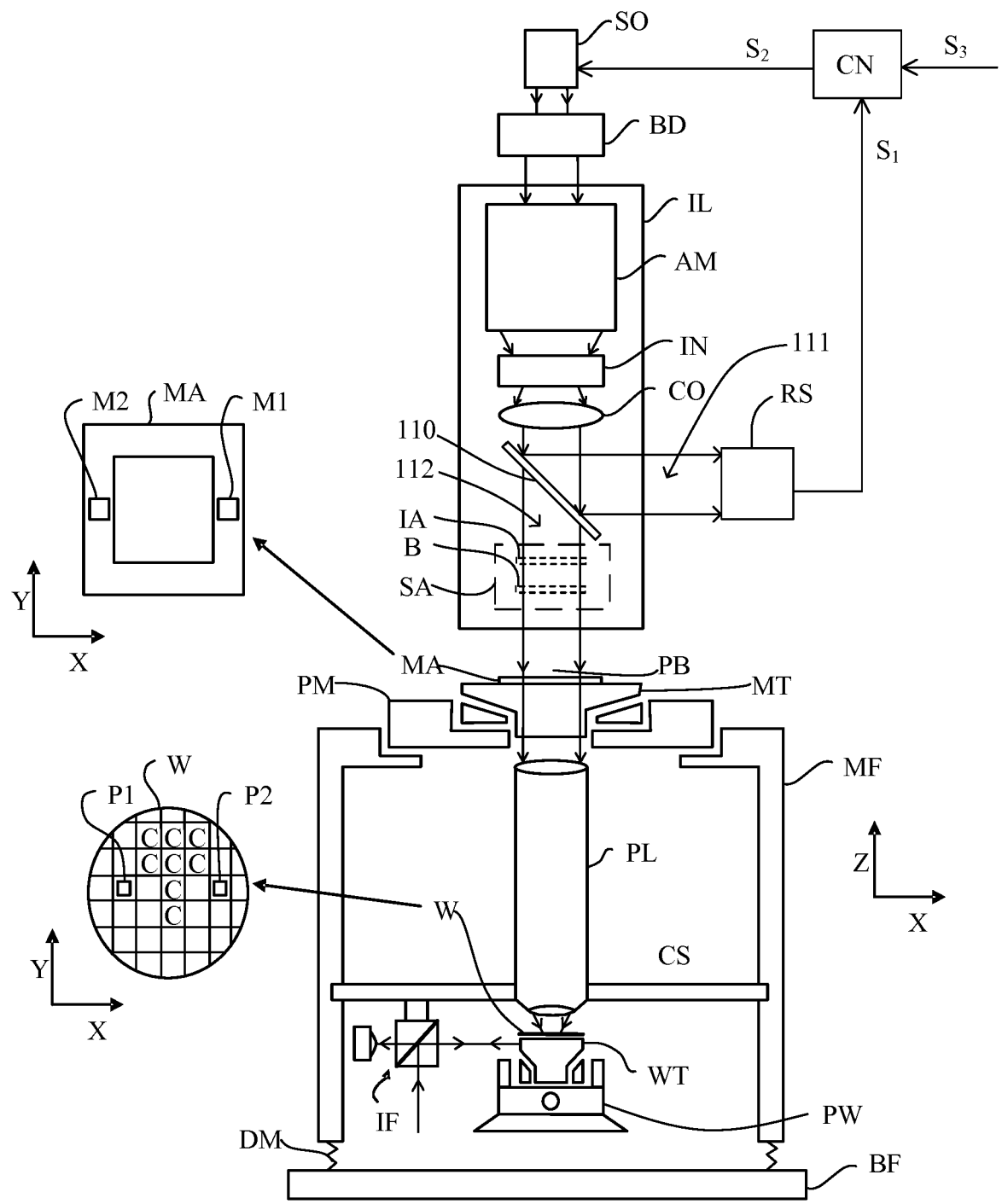
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may have a single substrate table and a single support structure. Alternatively, the lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL for conditioning a beam PB of radiation (e.g. UV radiation or DUV radiation);

a frame MF;

a base frame BF;

a support structure (e.g. a mask table) MT to support a patterning device (e.g. a mask) MA;

a substrate table (e.g. a wafer table) WT for holding a substrate (e.g. a resist coated wafer) W; and a projection system (e.g. a refractive projection lens) PL configured to image a pattern imparted to the radiation beam PB by patterning device MA onto a target portion C (e.g. comprising one or more dies) of the substrate W.

The base frame BF may be supported on the ground. In an embodiment, the frame MF is a vibration isolated frame that is substantially isolated from external influences, such as vibrations in the base frame BF, by the use of, e.g., one or more acoustically damping mounts DM, which support the frame MF on the base frame BF. These one or more acoustically damping mounts DM may be actively controlled to isolate vibrations which are introduced by the base frame BF and/or by the isolated frame MF itself.

The projection system PL is connected to the frame MF. The support structure MT is movably mounted to the frame MF via a first positioning device PM. The first positioning device PM may be used to move the patterning device MA, and to accurately position it, relative to the frame MF (and the projection system PL which is connected to the frame MF). The substrate table WT is movably mounted to the frame MF via a second positioning device PW. The second positioning device PW may be used to move the substrate W, and to accurately position it, relative to the frame MF (and the projection system PL which is connected to the frame MF). The second positioning device PW may be referred to as a scanning mechanism. Alternatively, the first and second positioning devices PM, PW may be collectively referred to as a scanning mechanism. The support structure MT and the substrate table WT may be referred to collectively as object tables.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The illuminator IL may be referred to as a radiation system. Alternatively, the source SO and the illuminator IL, together with the beam delivery system BD if required, may be collectively referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO.

The shape and (spatial) intensity distribution of the conditioned beam of radiation PB are defined by optics of the illuminator IL. In a scan mode, the conditioned radiation beam PB may be such that it forms a generally rectangular band of radiation on the patterning device MA. The band of radiation may be referred to as an exposure slit (or slit). The slit may have a longer dimension (which may be referred to as its length) and a shorter dimension (which may be referred to as its width). The width of the slit may correspond to a scanning direction (Y direction in FIGS. 1 and 2) and the length of the slit may correspond to a non-scanning direction (X direction in FIGS. 1 and 2). In a scan mode, the length of the slit limits the extent in the non-scanning direction of the target region C that can be exposed in a single dynamic exposure. In contrast, the extent in the scanning direction of the target region C that can be exposed in a single dynamic exposure is determined by the length of the scanning motion.

The terms "slit", "exposure slit" or "band of radiation" may be used interchangeably to refer to the band of radiation that is produced by the illuminator IL in a plane perpendicular to an optical axis of the lithographic apparatus. This plane may be at, or close to, either the patterning device MA or the substrate W. This plane may be stationary with respect to the frame MF. The terms "slit profile", "profile of the radiation beam", "intensity profile" and "profile" may be used interchangeably to refer to the shape of the (spatial) intensity distribution of the slit, especially in the scanning direction. In a plane perpendicular to an optical axis of the lithographic apparatus, an exposure region may refer to a region of the plane which can receive radiation.

In an embodiment, the illuminator IL comprises at least two masking blades (shown schematically in FIG. 1 as B). At least two of the masking blades are generally parallel to the length of the slit, the at least two masking blades being disposed on opposite sides of the slit. In an embodiment, each masking blade is independently movable between a retracted position wherein it is not disposed in the path of the radiation beam PB and an inserted position wherein it partially blocks the radiation beam PB. The masking blades are disposed in or near a field plane of the illuminator IL. Therefore, by moving the masking blades into the path of the radiation beam, the profile of the radiation beam PB can be sharply truncated thus limiting the extent of the field of radiation beam PB in the scanning direction. The masking blades can be used to control which parts of an exposure region receive radiation.

The illuminator IL may comprise an additional two or more masking blades (not shown) disposed generally parallel to the width of the slit, the additional two or more masking blades being disposed on opposite sides of the slit. The additional two or more masking blades may also be disposed in or near a field plane of the illuminator IL and may remain static. The additional two or more masking blades may limit the extent of the field of radiation beam PB in the non-scanning direction.

The patterning device MA is also disposed in or near a field plane of the lithographic apparatus. In one embodiment, the masking blades may be disposed adjacent to the patterning device MA such that both the masking blades and the patterning device MA lie in substantially the same plane. Alternatively, the masking blades may be separated from the patterning device MA such that they each lie in a different field plane of the lithographic apparatus and suitable focusing optics (not shown) may be provided between the masking blades and the patterning device MA.

The illuminator IL comprises an intensity adjuster IA (shown schematically in FIG. 1). In an embodiment, the intensity adjuster IA comprises a plurality of movable fingers arranged along one or both sides of the slit. In an embodiment, the fingers are arranged in pairs, each pair comprising one finger on each side of the slit (i.e. each pair of fingers is separated in the Y-direction). The pairs of fingers are arranged along the length of the slit (i.e. extending in the X-direction). In an embodiment, each or a group of movable fingers is independently movable in the scanning direction (Y-direction) from another movable finger or a group of fingers. That is, the fingers are moveable in a direction perpendicular to the length of the slit. In use, each or a group of movable fingers is independently movable in the scanning direction. For example, each or a group of movable fingers may be movable between at least a retracted position wherein the one or more movable fingers is not disposed in the path of the radiation beam and an inserted position wherein the one or more movable fingers partially block the radiation beam. In general fingers on a given side of the slit may be disposed at different Y positions. By moving the fingers, the shape and/or the intensity distribution of the slit can be adjusted.

The fingers may not be in a field plane of the lithographic apparatus and the field may be in the penumbra of the fingers such that the fingers do not sharply cut off the radiation beam PB. Pairs of fingers may be used to apply a different level of attenuation of the radiation beam PB along the length of the slit.

The intensity function of the radiation beam PB may vary across the width of the slit, which may correspond to a scanning direction. The shape of the intensity function across the width of the slit may be referred to as a profile of the radiation beam PB (or slit profile). The profile of the radiation beam PB may be substantially the same along the length of the slit. Additionally or alternatively, the integral of the intensity profile of the radiation beam PB across the width of the slit may be substantially constant along the length of the slit. This may be achieved by inserting the pairs of fingers into the path of the radiation beam PB by different amounts so as to attenuate the radiation beam by different amounts along the length of the slit. For such embodiments, where the pairs of fingers are inserted into the path of the radiation beam PB by different amounts, the profile of the radiation beam PB will vary slightly along the length of the slit.

The illuminator IL provides a conditioned beam of radiation PB, having a desired uniformity and intensity distribution in its cross section. The intensity adjuster IA and the masking blades B may be considered to define a slit aperture SA of the illuminator IL through which the conditioned beam of radiation PB exits the illuminator IL.

The radiation beam PB exiting the illuminator IL is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately relative to the frame MF, e.g. so as to position different target portions C in the path of the beam PB. Similarly, the first positioning device PM and another position sensor (which is not explicitly depicted in FIG. 1) can be used to accurately position the patterning device MA with respect to the frame MF, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. Patterning device MA and substrate W may be aligned using patterning device alignment marks M1, M2 and substrate alignment marks P1, P2.

The projection system PL may apply a reduction factor to the radiation beam PB, forming an image with features that are smaller than corresponding features on the patterning device MA. For example, a reduction factor of 4 may be applied.

In the scan mode, the first positioning device PM is operable to move the support structure MT relative to the beam of radiation PB that has been conditioned by the illuminator IL along a scanning path. In an embodiment, the support structure MT is moved linearly in a scanning direction at a constant scan velocity $v_{MT}$. As described above, the slit is orientated such that its width extends in the scanning direction (which coincides with the Y-direction of FIG. 1). At any instance each point on the patterning device MA that is illuminated by the slit will be imaged by the projection system PL onto a single conjugate point in the plane of the substrate W. As the support structure MT moves in the scanning direction, the pattern on the patterning device MA moves across the width of the slit with the same velocity as the support structure MT. In particular, each point on the patterning device MA moves across the width of the slit in the scanning direction at velocity $v_{MT}$. As a result of the motion of this support structure MT, the conjugate point in the plane of the substrate W corresponding to each point on the patterning device MA will move relative to the slit in the plane of the substrate table WT.

In order to form an image of the patterning device MA on the substrate W, the substrate table WT is moved such that the conjugate point in the plane of the substrate W of each point on the patterning device MA remains stationary with respect to the substrate W. The velocity (both magnitude and direction) of the substrate table WT relative to the projection system PL is determined by the demagnification and image reversal characteristics of the projection system PL (in the scanning direction). In particular, if the characteristics of the projection system PL are such that the image of the patterning device MA that is formed in the plane of the substrate W is inverted in the scanning direction then the substrate table WT should be moved in the opposite direction to the support structure MT. That is, the motion of the substrate table WT should be anti-parallel to the motion of the support structure MT. Further, if the projection system PL applies a reduction factor a to the radiation beam PB then the distance travelled by each conjugate point in a given time period will be less than that travelled by the corresponding point on the patterning device by a factor of a. Therefore the magnitude of the velocity $|v_{WT}|$ of the substrate table WT should be $|v_{MT}|$a.

The illuminator IL illuminates an exposure region of the patterning device MA with radiation beam PB and the projection system PL focuses the radiation at an exposure region in a plane of the substrate W. The masking blades of the illuminator IL can be used to control the width of the slit of radiation beam PB, which in turn limits the extent of the exposure regions in the planes of the patterning device MA and the substrate W respectively. That is the masking blades of the illuminator serve as a field stop for the lithographic apparatus. An example of how the masking blades are used is now described with reference to FIG. 2.

FIG. 2 illustrates the positions of two masking blades B1, B2 at different stages during the exposure of a target region 104 of a substrate W. Target region 104 may, for example, be any one of the target regions C illustrated in FIG. 1.

Figure 2A:
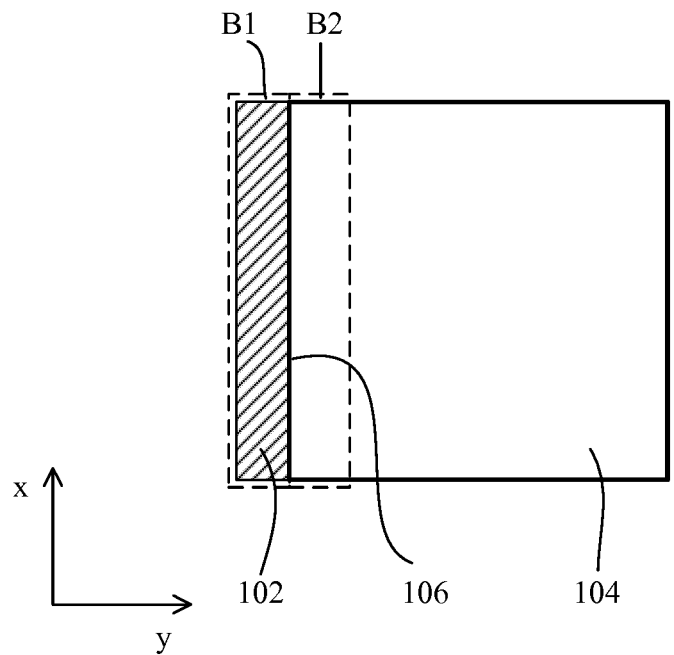
FIGS. 2A-2D illustrate the positions of a band of radiation projected onto a target region of a substrate by the lithographic apparatus of FIG. 1 and the positions of two masking blades during a dynamic exposure process.

As shown in FIG. 2A, at the start of a single dynamic exposure of the target region 104, the exposure region 102 in the plane of the substrate W (i.e. the portion of the substrate that the slit is projected onto by projection system PL) is adjacent to the target region 104. The extent of the exposure region 102 in the non-scanning direction (X-direction) is substantially the same as that of the target region 104 and the exposure region 102 is aligned with the target region 104 in the non-scanning direction (X-direction). The extent of the exposure region 102 in the scanning direction (Y-direction) may be different from that of the target region 104. In the scanning direction (Y-direction) the exposure region 102 is adjacent to the target region 104 such that the exposure region 102 neither overlaps nor is spaced apart from the target region 104 (i.e. a leading edge 106 of the exposure region 102 substantially coincides with an edge of the target region 104).

In FIG. 2, projections of the two masking blades B1, B2 onto the plane of the substrate W are shown as dashed lines. At the start of the dynamic exposure of target region 104 (with the target region 104 disposed as shown in FIG. 2A) a first one of the masking blades B1 of the slit is disposed in the path of the radiation beam, acting as a shutter, such that no part of the substrate W receives radiation. This ensures that an adjacent target region is not exposed to radiation.

Figure 2B:
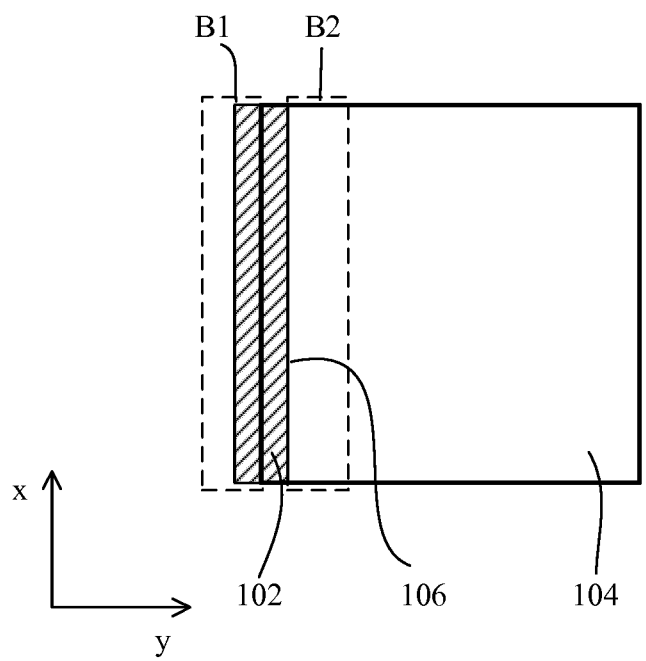

As a leading edge 106 of the target region 104 of the substrate W that is being exposed moves into the exposure region 102, the first masking blade B1 moves such that only the target region 104 receives radiation (i.e. no parts of the substrate outside of the target region 104 are exposed). That is, the masking blade B1 is disposed such that only the overlap between the exposure region 102 and the target region 104 receives radiation, as shown in FIG. 2B.

Figure 2C:
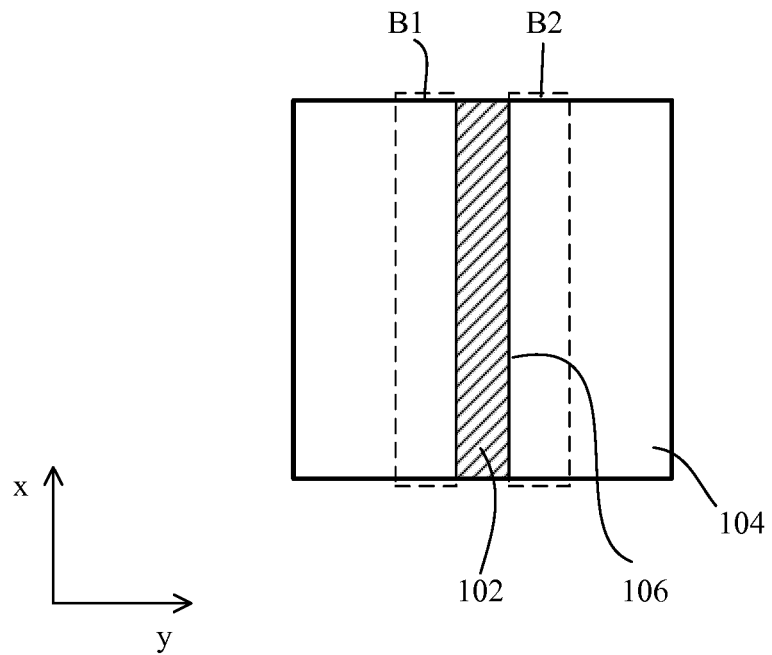
Figure 2D:
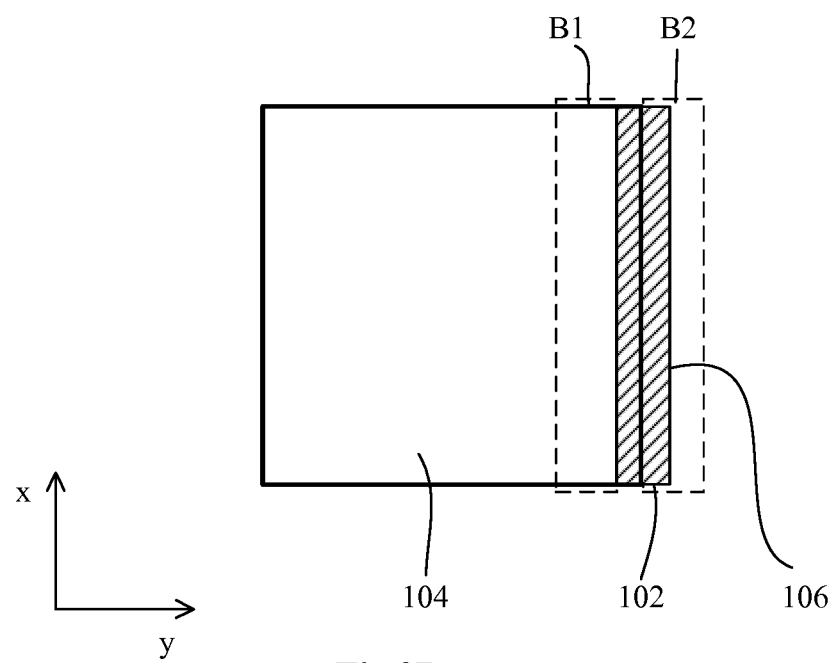

As shown in FIG. 2C, midway through the exposure of the target region 104 both masking blades B1, B2 are retracted out of the path of the radiation beam such that the entire exposure region 102 receives radiation. As the target region 104 of the substrate W moves out of the exposure region (i.e. an edge of the target region 104 passes the leading edge 106 of the exposure region 102), a second one of the masking blades B2 moves such that only the portion of the target region 104 that is disposed in the exposure region 102 receives radiation. This is illustrated in FIG. 2D.

The exposure region of the patterning device MA and the exposure region in a plane of the substrate W may be defined by the slit of radiation when the masking blades of the illuminator are not disposed in the path of the radiation beam PB.

Using the scan mode, the lithographic apparatus is operable to expose a target region C of the substrate W with substantially fixed area to radiation. For example, the target region C may comprise part of, one or several dies. A single substrate may be exposed to radiation in a plurality of steps, each step involving the exposure of a target region C followed by a movement of the substrate W. After exposure of a first target region C, the lithographic apparatus may be operable to move the substrate W relative to the projection system PL so that another target region C can be exposed to radiation. For example, between exposures of two different target regions C on the substrate W, the substrate table WT may be operable to move the substrate W so as to position the next target region so that it is ready to be scanned through the exposure region. This may be achieved, for example, by moving the substrate W so that the next target region is disposed adjacent to the exposure region 102. During exposure of each target region C, the radiation source SO generates pulses of radiation that are projected onto the target region C, as described above. In between exposure of two different target regions C, while the lithographic apparatus moves the substrate W so that the next target region C can be exposed to radiation, the radiation source SO does not emit radiation. Therefore using the scan mode the radiation source SO emits a plurality of bursts of pulses of radiation, each burst corresponding to a different target region C.

Alternatively, the depicted apparatus can be used in another mode, wherein the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

In order to help ensure critical dimension uniformity (CDU) the dose of radiation delivered to each portion of the substrate W may be controlled to within a specification. Therefore, in general, it is desirable to have accurate control over the dose of radiation received by each point on the substrate W. For example, it may be desirable to control the dose sufficiently accurately that variation of the critical dimension of features formed on the substrate W is below a desired threshold. The dose may be defined as the amount of energy per unit area which is received by the substrate W.

During a scanning exposure, the lithographic apparatus projects radiation as a band of radiation on to the substrate W. The dose of radiation E(r) delivered to a point (at position r) on the substrate W is given by a time integral of the irradiance I(r,t) of the radiation for that point:

$$E(r) = \int_{t_1}^{t_2} I(r, t)\, dt, \quad (1)$$

where $t_1$ is the time at which a leading edge of the band of radiation passes position r and $t_2$ is the time at which a trailing edge of the band of radiation passes position r. The irradiance is the power received by the substrate W per unit area. The dose of radiation E delivered to an extended region on the substrate W is given by a surface integral of the dose E(r) over the extended region.

As can be seen from Eq. (1), the dose received by a given point on the substrate W is dependent on the time taken $(t_2-t_1)$ for the band of radiation to pass that point. If the band of radiation moves over the substrate W at a generally constant velocity v then the time taken for the band of radiation to pass a given point is given by the ratio of the size of the band of radiation in the scanning direction to the velocity v.

The irradiance, which may vary with time, is the power received by the substrate W per unit area and is given by:

$$I(r,\, t) = P_{SO}(t) \times s(r,t) \times m(r), \quad (2)$$

where the $P_{SO}(t)$ is a power density of the radiation beam from radiation source SO; s(r,t) is a dimensionless distribution which describes a spatial intensity profile of the band of radiation output by the illuminator IL (i.e. the slit profile); and m(r) is a dimensionless distribution that represents the pattern imparted on the radiation beam by the patterning device MA. In the following discussion, for simplicity, the contribution to energy dose that arises from the pattern imparted on the radiation beam by the patterning device MA is ignored. Therefore in the following, the value of m is set at m=1.

The intensity profile s(r,t) of the band of radiation is dependent upon the optical components of the lithographic apparatus. In particular, the intensity profile s(r,t) is dependent upon the optics of the illuminator IL, including the slit aperture SA (as defined by the intensity adjuster IA and/or the masking blades B). In general, a point r on the substrate W may be defined by two coordinates x, y. For example, coordinate y may define the position of r in the scanning direction and coordinate x may describe the position of r in a direction substantially perpendicular to the scanning direction.

The value of the dimensionless distribution s(r,t) may be dependent upon the position of r in a scanning direction (y) and may be independent of the position of r perpendicular to the scanning direction (x). For such embodiments, the profile of radiation may be described by a one dimensional function $f(y)$, which describes a general shape of the profile of the radiation in the scanning direction, evaluated at y=vt. Alternatively, the value of the dimensionless distribution s(r,t) may be dependent upon the position of r in both the scanning and non-scanning directions. For such embodiments, at each different position in the non-scanning direction the profile of radiation may be described by a different one dimensional function $f_x(y)$, which describes a general shape of the profile of the radiation in the scanning direction, evaluated at y=vt.

The profile of the band of radiation in the scanning direction may have any convenient shape such as, for example, a 'top-hat' shape, a trapezoid like shape, or a truncated Gaussian (or 'Gaussian-like') shape. The intensity profile of the band of radiation in the scanning direction may comprise a generally flat central portion such that the majority of the pulses of radiation that hit each point on the substrate W contribute approximately the same amount to the dose received by that point. Furthermore, the intensity profile of the band of radiation in the scanning direction may fall to zero gradually on either side of the central flat portion, which may make the dose of radiation delivered to each point on the substrate W less sensitive to the phase of the radiation pulse train as the given point passes the leading edge of the profile, i.e. the amount of time which passes between the given point passing the leading edge of the profile and the first pulse irradiating it.

Figure 3:
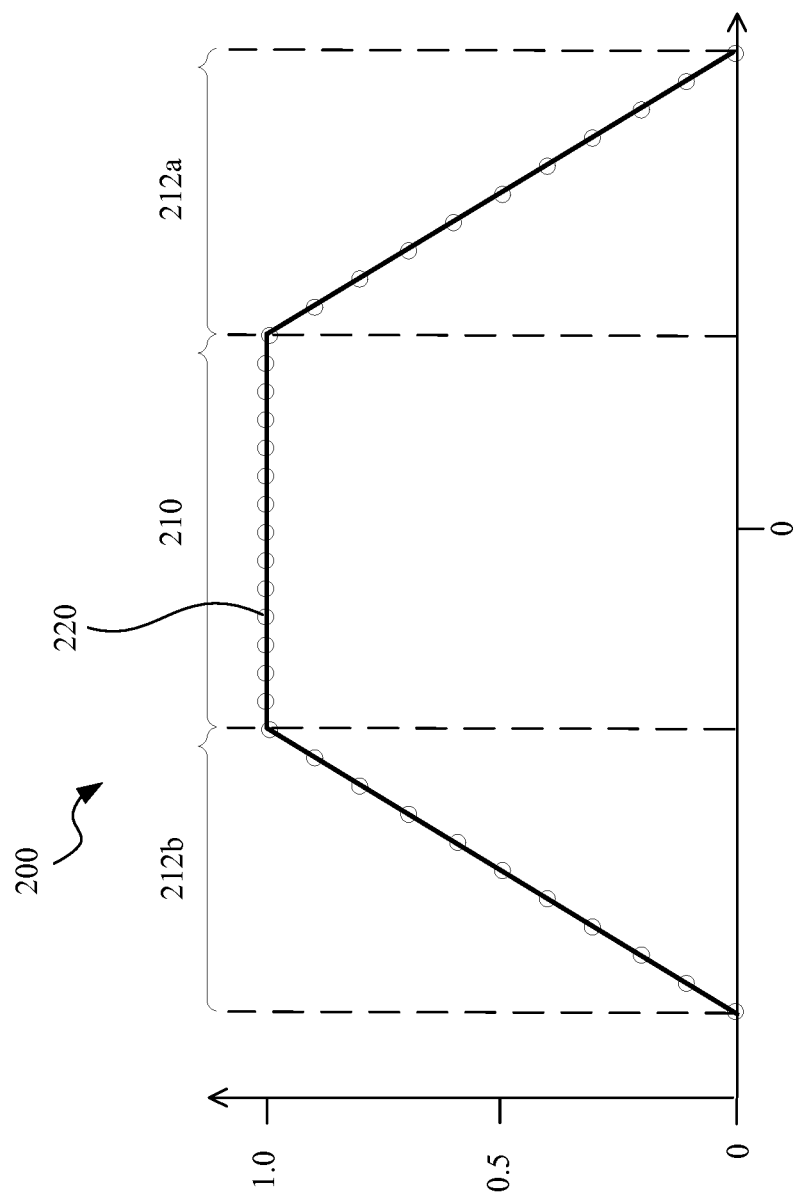
FIG. 3 shows an example slit profile of a band of radiation beam as a function of a scanning direction.

FIG. 3 shows an example slit profile 200 as a function of the scanning direction y. The slit profile 200 comprises a central portion 210 between two side portions 212a, 212b. In the central portion 210 the intensity is substantially constant. On either side of the central portion 210 the intensity falls linearly to zero in the two side portions 212a, 212b. Therefore, the shape of the slit profile 200 is an isosceles trapezoid. It will be apparent that other shapes may alternatively be used. For example, the profile may be more rounded than a trapezium.

From Eq. (1) it can be seen that when no patterning device MA is present (i.e. m=1) the dose E(y) received by a point (position y) on the substrate is given by a convolution of the profile of the band of radiation and the power density of the radiation source.

The radiation source SO may produce a radiation beam which is pulsed with a pulse frequency $f_p$. For example, the radiation source SO may comprise a laser (e.g. an excimer laser) which produces a pulsed radiation beam having a pulse frequency $f_p$. For such an arrangement, the dose of radiation which is received by a given point on the substrate W is a sum (over all pulses which irradiate that given point) of the doses of radiation delivered by each pulse. The number of pulses which contribute to the dose for a given point is dependent upon: the time taken for that point to sweep past the band of radiation; the pulse frequency $f_p$; and the phase of the radiation pulse train as the given point passes the leading edge of the profile, i.e. the amount of time which passes between the given point passing the leading edge of the profile and the first pulse irradiating it.

For embodiments utilizing a pulsed radiation source SO, the power density of the radiation beam will be dependent upon the pulse train of the radiation source. For example, the power density of the radiation beam may be given by:

$$P_{SO}(t)=P(t)\times p(t), \quad (3)$$

where P(t) is an amplitude of the power density of the radiation source and p(t) is a dimensionless pulse waveform. P(t) may be viewed as the power density of an equivalent continuous radiation source and the pulse waveform describes how this is sampled at the pulse frequency $f_p$. The pulsed radiation may have any pulse train. The shape, duration and frequency of the pulses may be chosen as desired or required. The pulse frequency may, for example, be around 6 KHz, which is equivalent to a pulse time period of around 0.17 ms (although other pulse frequencies may be used).

The duration of the pulses may be significantly smaller than the time period of the pulse train. For such embodiments, p(t) may be approximated by a sum of Dirac delta functions of the form $\delta(t-t_i)$, where $t_i$ is the time at which the ith pulse irradiates the substrate W. With this approximation, from Eqs. (1) and (3), the dose of radiation E(r) delivered to a point (at position r) on the substrate W is given by:

$$E(r) = \sum_i E_i \times s(r, t_i), \quad (4)$$

where the sum is over all pulses that hit the position r, i.e. all pulses that occur between the time $t_1$ at which a leading edge of the band of radiation passes position r and the time $t_2$ at which a trailing edge of the band, and $E_i$ is the energy (per unit area) of the ith pulse. The ratio of the time period of the pulse train to the duration of the pulses may, for example, be of the order of 1000 (or may be some other value). The duration of the pulses may, for example, be around 150 ns (although other pulse durations may be used).

The dose of radiation received by a given point on the substrate W is a sum over all pulses that hit that point of the energy of each pulse, weighted by the value of the slit profile at the position of the given point when the pulse irradiates it. In FIG. 3, a plurality of dots 220 are shown overlaid on slit profile 200. Each dot 220 represents an example position in the scanning direction y of a given point on the substrate W (relative to the slit) when one of the pulses of radiation irradiates the substrate W.

From Eq. (4) it can be seen that, the dose delivered to each point on the substrate is dependent on both: (a) the energy (or, equivalently, the power) of the pulses of radiation produced by the radiation source SO; and (b) the shape of the slit profile produced by the illuminator IL. Therefore, the dose of radiation delivered to the substrate W may be controlled by controlling one or both of the output power of the radiation source SO and the shape of the slit profile produced by the illuminator IL (e.g. using the intensity adjuster IA).

In order to control the dose of radiation delivered to each point on the substrate W, the output power of the radiation source SO is controlled using a feedback loop that comprises a controller CN and radiation sensor RS, as described further below. The output power of the radiation source SO may be controlled in real time using this feedback loop while the slit profile remains fixed. With such an arrangement, in order to determine the actual dose of radiation that is delivered to each point on the substrate W (or ensure that a desired dose is delivered to each point on the substrate W), the controller CN may require some information regarding the slit profile. Therefore, before a substrate W is exposed to radiation in the lithographic apparatus, a calibration method may be performed to measure information related to the slit profile. This information can be used by the radiation sensor RS and/or the controller CN to help ensure that a desired dose of radiation is delivered to each part of the substrate W.

In an embodiment, the radiation sensor RS is operable to measure an energy E, of each pulse or a set of pulses of radiation produced by the radiation source SO. So, the radiation sensor RS is further operable to output a signal $S_1$ indicative of the energy $E_i$ to the controller CN. Signal $S_1$ allows the controller CN to monitor the energy of each pulse or set of pulses of the radiation source. The controller CN is configured to output a control signal $S_2$ to the radiation source SO (e.g. laser), which control signal is used to control one or more variables of the radiation source SO.

The radiation sensor RS may be any sensor suitable for measuring the energy of radiation incident upon the radiation sensor RS. For example the radiation sensor RS may be a photodiode. The radiation sensor RS may be positioned such that at least a portion of the radiation beam produced by the radiation source SO is incident upon the radiation sensor RS. For embodiments wherein only a portion of the radiation beam produced by the radiation source SO is incident upon the radiation sensor RS, the relationship between the dose received by the radiation sensor RS and the dose received by the substrate W should be known so that the latter can be determined from a measurement of the former.

An example positioning of the radiation sensor RS is depicted in FIG. 1. A partially transmissive mirror 110 is positioned in the illuminator IL. The partially transmissive mirror 110 reflects a first portion 111 of the radiation beam onto the radiation sensor RS. The remainder 112 of the radiation beam is transmitted by the partially transmissive mirror 110 and passes to the patterning device MA. The fraction of the radiation beam which is reflected by the partially transmissive mirror 110 (the first portion 111) may, for example, be of the order of a few percent or less of the radiation beam. If this fraction is known, the energy of the radiation beam 112 which is transmitted by the partially transmissive mirror 110 may be calculated using measurements made by the radiation sensor RS. If the fraction is not known, the radiation sensor RS may be calibrated with a second radiation sensor (not shown) by replacing the substrate with the second radiation sensor and comparing the energy measured by both radiation sensors.

It will be appreciated that in other embodiments the partially transmissive mirror 110 and the radiation sensor RS may be located at other positions along the path of the radiation beam. For example the partially transmissive mirror 110 and the radiation sensor RS may be positioned before the illuminator IL (e.g. in the beam delivery system).

The controller CN also receives a reference energy signal $S_3$. The reference energy signal $S_3$ is indicative of a reference energy for each pulse or a set of pulses. The reference energy sets the overall scale of the dose that is delivered to the substrate W. The reference energy may, for example, be a desired average energy for the pulses of radiation in order to ensure that a desired dose is delivered to each point on the substrate W. The reference energy may be dependent on information regarding the slit profile, which may have been determined during a calibration method. For example, before a substrate W is exposed to radiation in the lithographic apparatus, a calibration method may be performed to measure information related to the slit profile. This information is used to generate the reference energy signal $S_3$, which is received by the controller CN. The reference energy may be proportional to a desired energy dose and may be inversely proportional to: the average value of the slit profile across the scanning direction and the average number of pulses that irradiate a point on the substrate W. The average number of pulses that irradiate a point on the substrate W is dependent on the pulse frequency of the radiation source SO, the width of the slit and the scan velocity $v_{WT}$ of the substrate table WT.

Figure 4:
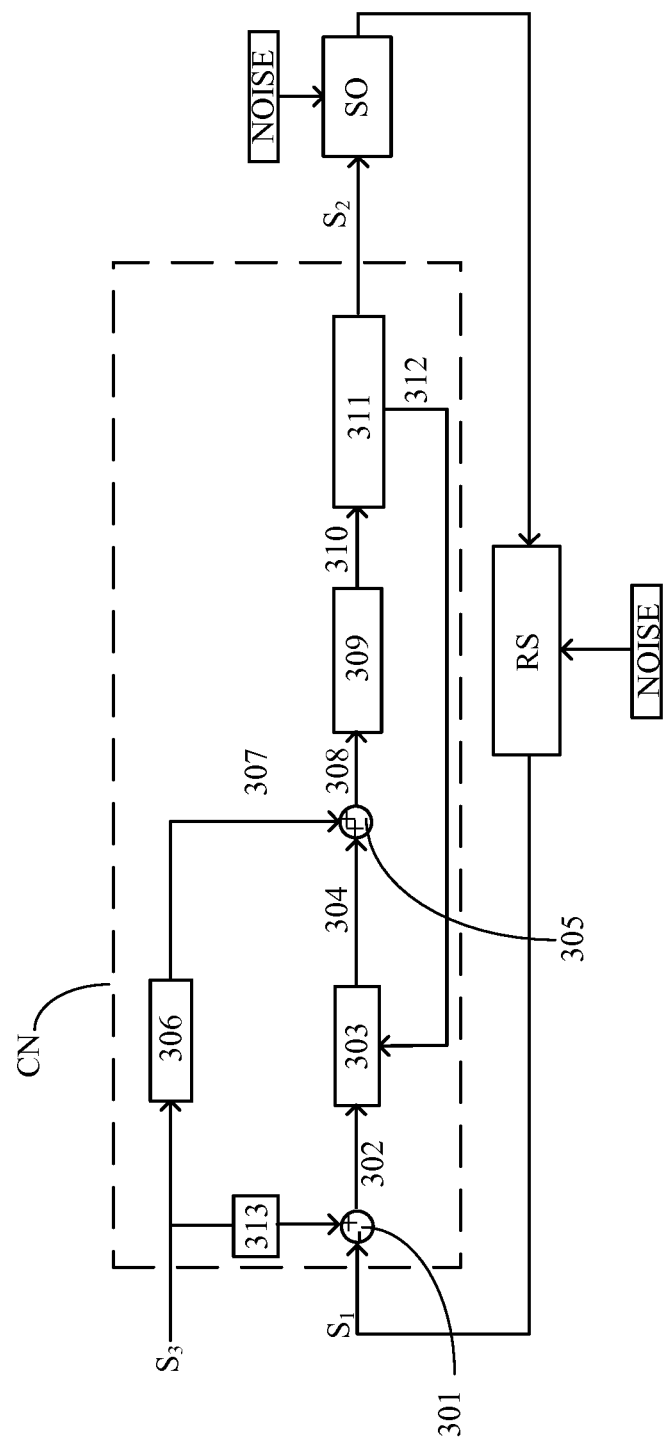
FIG. 4 is a schematic illustration of a control loop that is used to control the power of the radiation source of the lithographic apparatus shown in FIG. 1.

The feedback loop comprising the controller CN, the radiation sensor RS and the radiation source SO for controlling the dose of radiation delivered to each point on the substrate W is now described further with reference to FIG. 4. The feedback loop receives as inputs, the signal $S_1$ (indicative of the energy of each pulse or a set of pulses of radiation) output by the radiation sensor RS and the reference energy signal $S_3$. The output of the feedback loop is the control signal $S_2$ that is sent to the radiation source SO.

The feedback loop comprises a feedback box 303 and a feed-forward box 306. The feedback loop also uses two adders 301, 305. It will be appreciated that in this context an adder (also referred to as a summer) is a circuit that is operable to find the sum or difference between two input signals.

As explained above, the reference energy signal $S_3$ is indicative of a reference energy for each pulse or a set of pulses. In general, the reference energy signal may have a profile over the scanning exposure of a substrate W, e.g., the reference energy signal for one pulse may be different to the reference energy signal for another pulse. For example, the reference energy signal may be dependent on which part of the substrate W is being exposed. In some embodiments, the reference energy signal $S_3$ may have a flat profile, i.e. the reference energy signal $S_3$ may be substantially constant over a plurality of pulses.

A first adder 301 is arranged to determine a difference 302 between a reference energy for each pulse or a set of pulses and the monitored energy of that pulse or set of pulses. In particular, for example, the first adder 301 receives as input the signal $S_1$ indicative of the energy of the previous pulse of radiation and the reference energy signal $S_3$ for the previous pulse of radiation. In order for the first adder 301 to receive the reference energy signal $S_3$ for the previous pulse of radiation, the reference energy signal $S_3$ for the current pulse of radiation passes into a buffer 313 that introduces a one pulse delay.

The difference 302 determined by the first adder 301 is input into the feedback box 303. This difference 302 represents an error signal, being the difference between, e.g., a desired average energy for the previous pulse of radiation (represented by reference energy signal $S_3$) and the actual energy of the previous pulse of radiation.

The feedback box 303 is operable to determine a feedback value 304. The feedback value 304 is dependent on the determined differences between the reference energy and the monitored energy for a preceding time period (i.e. for one or more preceding pulses). In general, the feedback box 303 may use any of the following: proportional feedback, integral feedback, differential feedback, or any combination selected from these, to determine the feedback value 304. For such embodiments, in general, the the controller CN may be referred to as a PID controller. For embodiments using only a proportional feedback system, the feedback value 304 is proportional to the difference 302 determined by the first adder 301. For embodiments using only an integral feedback system, the feedback value 304 is proportional to sum of the differences 302 determined by the first adder 301 for a preceding number of pulses (for example for all of the preceding pulses in the current burst). For embodiments using only a differential feedback system, the feedback value 304 is proportional to the rate of change of the differences 302 determined by the first adder 301. Although the specific example of PID controllers, which use any combination of proportional feedback, integral feedback and/or differential feedback has been discussed here, it will be apparent to the skilled person that the present description is not specific to such feedback systems and other embodiments may use different feedback systems.

As will be discussed further below, embodiments described herein are particularly applicable, for example, to systems where one or more parameters of the radiation source SO (and/or their rates of change) which are controlled using the control signal $S_2$ have an allowed operational range. The feedback box 303 may generate a feedback value 304 that may result in one or more of the parameters and/or their rates of change lying outside of the allowed operational range. Such a situation may be more likely when using a very aggressive control loop. Therefore, embodiments described herein are particularly applicable to, e.g., a very aggressive control loop. In here, an aggressive control loop is a control loop with a fast response and which attempts to reduce the effects of an error quickly, i.e. over a relatively small number of pulses.

The reference energy $S_3$ for the subsequent pulse is input into the feed-forward box 306. Feed-forward box 306 outputs reference energy signal 307 for the subsequent pulse which is proportional to the input reference energy $S_3$ for the subsequent pulse. The constant of proportionality may be 1.

A second adder 305 is arranged to add the reference energy signal 307 from the feed-forward box 306 to the feedback value 304 from the feedback box 303 to produce a desired energy 308 for the subsequent pulse of the radiation source SO. The feedback value 304 is determined such that the desired energy 308 of the subsequent pulse at least partially compensates for a difference between the reference energy $S_3$ and the monitored energy $S_1$ over the preceding time period (one or more pulses).

Once the desired energy 308 of the next pulse is known, this is converted into desired values for one or more input parameters of the radiation source SO that should achieve the desired energy 308. This conversion into desired values for one or more input parameters of the radiation source SO is performed by a converter box 309 and a limiter box 311.

In general, energy is supplied to the radiation source SO. For example, for embodiments wherein the radiation source is a laser, energy may be supplied to the gain medium of the laser by an external source. This process is known as pumping, and the external source may comprise: an electrical power supply (electrical pumping), electromagnetic radiation (optical pumping), gas flow (gas dynamic pumping), or some other suitable energy source. The external power source may be adjustable, so that the amount of pump power supplied to the gain medium can be varied. The external power source may be provided with one or more input parameters that can be varied so as to vary the power supplied to the gain medium. For example, in the case of a gas laser such as an excimer laser the external power source may comprise a pair of discharge conductors across which a high voltage is applied. For such embodiments, the power supplied to the gain medium can be varied by varying the voltage applied across the conductors. In the case of a gas discharge lamp such as a mercury lamp the external power source may comprise a pair of main electrodes across which a voltage is applied to establish and maintain an electric arc. For such embodiments, the power supplied to the gain medium can be varied by varying the voltage applied across the main electrodes.

In general, the output energy of the laser beam will be dependent upon the pump power supplied by the external power source. If a relationship between the one or more parameters of the external power supply (e.g. a high voltage applied across a pair of discharge conductors) and the output energy of the beam is known, a desired output energy may be achieved by choosing the values of the parameters accordingly. The relationship may be parameterized as a polynomial with one or more free relationship parameters that may be determined during a calibration method. Furthermore, the relationship may vary with time and therefore it may be necessary to perform a calibration periodically.

In some embodiments, the radiation source SO may be an EUV radiation source. Such an EUV source may comprise a discharge produced plasma (DPP) source, a laser produced plasma (LPP) source, and/or a free electron laser (FEL). For such embodiments the EUV radiation source SO may have one or more input parameters that can be varied so as to vary the output energy of the radiation source SO.

The converter box 309 is operable to receive the desired energy 308 and to calculate one or more input parameters of the radiation source SO in dependence thereon. In particular it calculates values for one or more input parameters of the radiation source SO that would be expected to result in the next pulse being generated with the desired energy 308. The conversion of the desired energy 308 to parameters of the radiation source is done using a relationship between the two. In general, the relationship may comprise one or more tunable relationship parameters which can be determined during a calibration process. The calibration process may be performed in between exposure of different substrates W and/or online during exposure of a substrate W.

An example embodiment of a radiation source SO with one input parameter and how a desired output energy 308 of the radiation source can be converted into a value of the parameter is now described. In an embodiment, the radiation source SO comprises an excimer laser and the power of the laser is dependent upon the high voltage V applied across two conductors. In particular, an energy E of each pulse of radiation output by the radiation source SO is dependent upon the high voltage V applied across two conductors. The energy E of pulses of radiation output by the radiation source SO may be referred to as the output energy E of the radiation source. In general, this relationship is non-linear. However, for a range of voltages V that are used in practice, the output energy E of the laser may be well approximated by a polynomial expansion of the voltage V. For a sufficiently small range of voltages V, the relationship between the output energy E and the voltage may be approximated by a linear relationship:

$$E = O + G \times V, \tag{5}$$

where the gain G and the offset O of the laser are two relationship parameters which can be determined during a calibration method. For larger ranges of voltage, a higher order polynomial with more tunable parameters may be necessary to parameterize the relationship between the voltage V and the output energy E.

In practice, the output energy E of the radiation source SO may include an element of noise, as indicated in FIG. 4. Furthermore, the measurement of the energy of each pulse of radiation by the radiation sensor RS may introduce additional noise, as indicated in FIG. 4. Therefore the calibration method may use data from an extended time period to evaluate the relationship parameters used in the relationship between the one or more variables of the external power supply and the output energy. The values of the parameters may drift with time as the lithography apparatus is operating, and therefore the parameters may be determined periodically using the calibration method.

For embodiments comprising an excimer laser the converter box 309 may be operable to receive the desired energy 308 and to calculate a value for high voltage across the two conductors that would be expected to result in the next pulse being generated with the desired energy 308. The conversion of the desired energy 308 to a high voltage may be done using the relationship in Eq. (5).

The converter box 309 outputs a signal 310 containing the desired values for one or more input parameters of the radiation source SO. The signal 310 is received by the limiter box 311. The limiter 311 limits the values of the one or more parameters to within an allowed range. In the following the allowed operational range may be interchangeably referred to as the allowed range, the allowed operational range or the allowed performance range. This helps ensure that the one or more parameters and their rates of change are within an allowed operational range of the radiation source SO. The one or more parameters and their rates of change may be limited to the allowed operational ranges to ensure that a performance of the radiation source (for example, the dose delivered to the substrate and the wavelength and/or bandwidth of the radiation) is acceptable.

The limiter 311 outputs a signal $S_2$ which is received by the radiation source SO. The signal $S_2$ contains values for one or more input parameters of the radiation source SO (e.g. a high voltage across a pair of conductors).

If the values of the one or more parameters of the radiation source SO determined by the converter box 309 are within the allowed operational range then the signal $S_2$ contains the values for one or more input parameters of the radiation source SO as determined by the converter box 309. However, if the values of the one or more parameters of the radiation source SO determined by the converter box 309 lie outside of the allowed operational range then the limiter 311 alters the values of the one or more parameters of the radiation source SO such that they do lie in the allowed operational range. Furthermore, the signal $S_2$ contains the values for one or more input parameters of the radiation source SO as limited by the limiter 311.

Under normal operating conditions, in the feedback loop described above with reference to FIG. 4 the measured energy of each pulse of radiation is fed back to the controller CN by the radiation sensor RS in a way that tends to reduce fluctuations in the output energy of the radiation source SO. Therefore, under such normal operating conditions, the feedback loop may be considered to function as a negative feedback loop.

When limiter 311 limits the values of the one or more parameters of the radiation source SO the control loop can become unstable and may function as a positive feedback loop. This is particularly so for embodiments wherein the feedback box 303 comprises an element of integral feedback, that is, for embodiments wherein the feedback value 304 is dependent on the determined differences between the reference energy and the monitored energy for more than one preceding pulse. For such embodiments, under certain circumstances (if the integrated error has the same sign as the limited value), the control loop may operate as a positive feedback loop. That is, rather than tending to reduce fluctuations in the output energy of the radiation source SO, the feedback loop may cause such fluctuations to increase in magnitude. This may be referred to as "wind-up".

To prevent such wind-up behavior, under certain circumstances, the limiter 311 may output a signal 312 to the feedback box 303. Upon receipt of such a signal, the cumulative offset error of one or more integrators within the feedback box may be reset to zero. When such reset of a cumulative offset error occurs, the integrated offset error is lost. As a result, the integrated offset error is not compensated for by the feedback loop. This results in an increase of the dose error, which is not desirable.

The above described control feedback loop may be optimized so as to minimize dose variation for a given slit profile and may therefore be an aggressive control loop. This may result in excellent dose performance as long as the pulse to pulse energy variations remain relatively small, for example within 5% of a desired energy (i.e. the reference energy). However, occasionally a large dip in pulse energy can occur, for example a pulse may have less than 50% of the desired energy. Such a pulse may be referred to as a drop out pulse. Among other reasons, this may be due to laser chamber dropouts or beam steering issues. Alternatively or in addition, a large increase in pulse energy can occur, for example a pulse may have more than 150% of the desired energy. Such a pulse may be referred to as a drop in pulse. This could happen when the laser efficiency is for some reason much higher than its average value. Since the feedback loop is an aggressive control loop, these drop out or drop in pulses can result in a controller response that is so large that the limiter 311 limits the values of the one or more parameters to within the allowed range of the radiation source SO. This results in large dose errors for aforementioned reasons. For example the dose error may be greater than 1%. In turn, this can result in defects in the image formed on the substrate W.

Embodiments described herein relate to a novel method for controlling the output of a pulsed radiation source that is less sensitive to large fluctuations in pulse energy. To achieve this, the dynamic response of the control feedback loop is different for large variations in pulse energy. That is, the method comprises at least two separate modes of operation: (a) a first mode for normal operation where the variation in pulse energy is relatively small; and (b) a second mode for operation in response to the detection of a pulse which deviates significantly from the desired energy. In response to the detection of a pulse which deviates significantly from the desired energy (i.e. the magnitude, or absolute value, of the difference 303 between the monitored energy $S_1$ and the reference energy $S_3$ exceeds a threshold value) the method may automatically switch from operation in the first mode to operation in the second mode. Note that the magnitude, or absolute value, of the difference 303 between the monitored energy $S_1$ and the reference energy $S_3$ is always positive.

The threshold value may be dependent upon the operational range of the one or more input parameters of the radiation source SO. The threshold value may also be dependent upon the typical amplitude of noise on the signal $S_1$. In some embodiments, the threshold value may be 25% of the reference energy, and may be 50% of the reference energy, and may be 75% of the reference energy. Note that the switching from operation in the first mode to operation in the second mode is in response to the detection of a pulse for which the magnitude, or absolute value, of the difference 303 between the monitored energy $S_1$ and the reference energy $S_3$ exceeds the threshold value. Therefore, for a threshold value of 25% of the reference energy the method will automatically switch from operation in the first mode to operation in the second mode for a pulse with less than 75% of the reference energy or a pulse with greater than 125% of the reference energy.

Operation in the first mode is as described above. In the event that the magnitude of the determined difference between the monitored energy $S_1$ and the reference energy $S_3$ exceeds the threshold value, the method switches to operation in the second mode. The pulse for which the magnitude of the determined difference between the monitored energy $S_1$ and the reference energy $S_3$ exceeds the threshold value may be referred to as a "triggering pulse", a "drop out pulse" or a "drop in pulse". The (magnitude of) the determined difference between the monitored energy $S_1$ of a drop out pulse and the reference energy $S_3$ may be referred to as the "drop out error".

In the second mode, the difference between the monitored energy of the triggering pulse and the reference energy as determined by the first adder 301 does not contribute to the feedback value 304. Effectively, the signal 302 which is input to the feedback box 303 is set to zero. This prevents the feedback loop from reacting aggressively to the large difference determined by the first adder 301.

In addition, in the second mode, the reference energy signal 307 which is sent to the second adder 305 is altered for one or more subsequent pulses (following the triggering pulse) in the following way. The difference between the reference energy $S_3$ and the monitored energy $S_1$ of the triggering pulse is added to the reference energy signal 307 for the one or more subsequent pulses, spread over the one or more subsequent pulses. That is, a fraction of the difference between the reference energy $S_3$ and the monitored energy $S_1$ of the triggering pulse is added to each of the one or more subsequent pulses such that the sum of the fractions is equal to the total difference between the reference energy $S_3$ and the monitored energy $S_1$ of the triggering pulse.

After the one or more subsequent pulses, the feedback loop returns to operation in the first mode.

Effectively, the method according to embodiments of the disclosure involves both the detection of drop out (and/or drop in) pulses and mitigation of the impact of such drop out pulses by altering the control response for a subsequent time period (typically a relatively small number of subsequent pulses). In response to a drop out pulse or a drop in pulse, the response of the control loop is altered such that instead of the difference 302 between the determined energy of the triggering pulse and the reference energy signal $S_3$ being input to the feedback box 303, it is added to the reference energy signal 307 for one or more subsequent pulses, spread over the one or more subsequent pulses. The above described method is advantageous for a number of reasons, as now discussed.

Following a dropout pulse or drop in pulse, the signal 302 sent to the feedback box 303 is zero and therefore the feedback box 303 does not react aggressively to compensate for the drop out pulse. Without this switch to the second control mode, an aggressive response from the feedback box 303 may result in a period of unstable behavior. In addition, an aggressive response may result in desired values for one or more input parameters of the radiation source SO that lie outside of the operational range of the radiation source SO. In turn, these may be limited or clipped by the limiter box 311. Furthermore, under certain circumstances, the limiter 311 may output a signal 312 to the feedback box 303 to reset the cumulative offset error of one or more integrators within the feedback box 303 to zero, which may cause an increase in dose error (depending on the size of the dropout error and its location within the burst of pulses). Therefore, by switching to the second control mode, undesired increase in dose errors can be avoided.

The drop out error is added to the reference energy signal 307, spread over one or more subsequent pulses. Therefore, although the drop out error is not sent to the feedback box 303, it is not discarded and is compensated for by the one or more subsequent pulses so as to reduce the impact of the drop out pulse on dose performance.

The drop out error can be spread over the one or more subsequent pulses in a variety of different ways. The way in which the drop out error is spread over the one or more subsequent pulses may be referred to as a reference energy signal adjustment profile. The reference energy signal adjustment profile may be optimized to compensate for the drop out error as efficiently and quickly as possible, while staying within the operational range of the one or more parameters of the radiation source SO.

The number of subsequent pulses over which the drop out error is spread may be dependent on the magnitude of the drop out error. The reference energy signal adjustment profile may be dependent on the magnitude of the drop out error.

In some embodiments, the method may be tailored to use substantially the entire operational range of the one or more parameters of the radiation source SO to correct for a drop out pulse. By using substantially the entire operational range of the one or more parameters of the radiation source SO, the number of subsequent pulses over which the correction for the drop out pulse is spread can be minimized.

In one embodiment, the reference energy signal adjustment profile is constant, i.e. the drop out error is divided equally over a number of subsequent pulses.

An example embodiment of the novel method for controlling the output of a pulsed radiation source is now described with reference to FIGS. 5A and 5B.

Figure 5A:
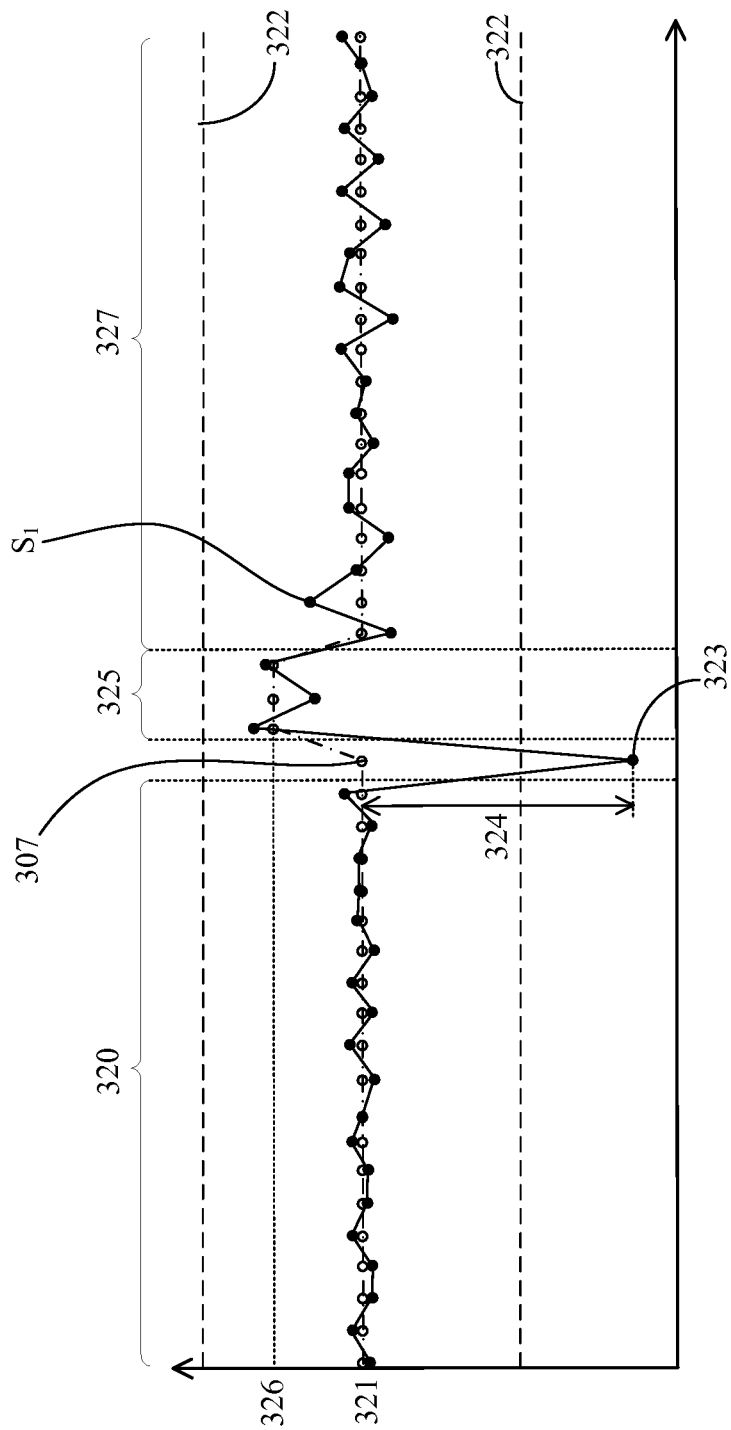
FIG. 5A shows the reference energy signal (dot-dashed line) and the signal (solid line) indicative of the energy of each pulse of radiation as a function of time during a time period in which the radiation source produces a drop out pulse for a method with at least two different operation modes.

FIG. 5A shows an example reference energy signal 307 (open circles and dot-dashed line) and example signal $S_1$ (filled circles and solid line) indicative of the energy of each pulse of radiation as determined by a radiation sensor RS as a function of time. Note that the reference energy signal 307 and the signal $S_1$ are discrete signals that only have a meaning at discrete time intervals (which correspond to the pulses of radiation output by the radiation source SO), as represented by the open and filled circles respectively. The dot-dashed and solid lines connecting these points are illustrated to provide a guide to the eye. For a first time period 320, the method operates in a first mode, the reference energy signal 307 is substantially constant at an energy of 321 and the signal $S_1$ indicative of the energy of the pulses of radiation oscillates about the energy 321 with time under the influence of the feedback box 303. During the first time period 320 variations in pulse energy are relatively small such that the magnitude of the difference between the monitored energy $S_1$ and the reference energy signal 307 is less than a threshold value, as indicated by dashed lines 322. In this example, the threshold value is 50% of the reference energy signal 307 although it will be appreciated that other threshold values may alternatively be used.

Following the first time period 320, the radiation source SO produces a drop out pulse 323, which deviates significantly from the desired energy (i.e. the reference energy signal 307). The magnitude of the difference 324 between the monitored energy $S_1$ of the drop out pulse 323 and the reference energy signal 307 exceeds the threshold value. In this example, the energy of the drop out pulse 323 is approximately 15% of the reference energy signal 307. In response to the drop out pulse, the method automatically switches from operation in the first mode to operation in the second mode.

In the second mode, the difference 324 between the monitored energy of the drop out pulse and the reference energy signal 307 does not contribute to the feedback value. Effectively, the signal 302 which is input to the feedback box 303 is set to zero. This prevents the feedback loop from reacting aggressively to the large difference 324.

In addition, in the second mode, the reference energy signal 307 is altered for a plurality of subsequent pulses (following the drop out pulse) in a second time period 325 that immediately follows the drop out pulse 323. In this example, there are three pulses of radiation emitted during the second time period 325. The difference 324 between the reference energy 307 and the monitored energy $S_1$ of the drop out pulse is added to the reference energy signal 307 for the subsequent pulses, spread over three subsequent pulses. In the present example, the drop out error 324 is spread over the three subsequent pulses using a constant reference energy signal adjustment profile such that the drop out error 324 is divided equally over the three subsequent pulses. That is, a third of the drop out error 324 is added to the reference energy signal 307 for each of the three subsequent pulses. Therefore during the second time period 325 the reference energy signal 307 is substantially constant at an energy of 326 and the signal $S_1$ indicative of the energy of the pulses of radiation oscillates about the energy 326 with time under the influence of the feedback box 303.

After the three subsequent pulses (i.e. the second time period 325), the feedback loop returns to operation in the first mode for a third time period 327. During the third time period 327 the reference energy signal 307 is returned to the substantially constant energy 321 and the signal $S_1$ indicative of the energy of the pulses of radiation oscillates with time about the energy 321 under the influence of the feedback box 303.

Figure 5B:
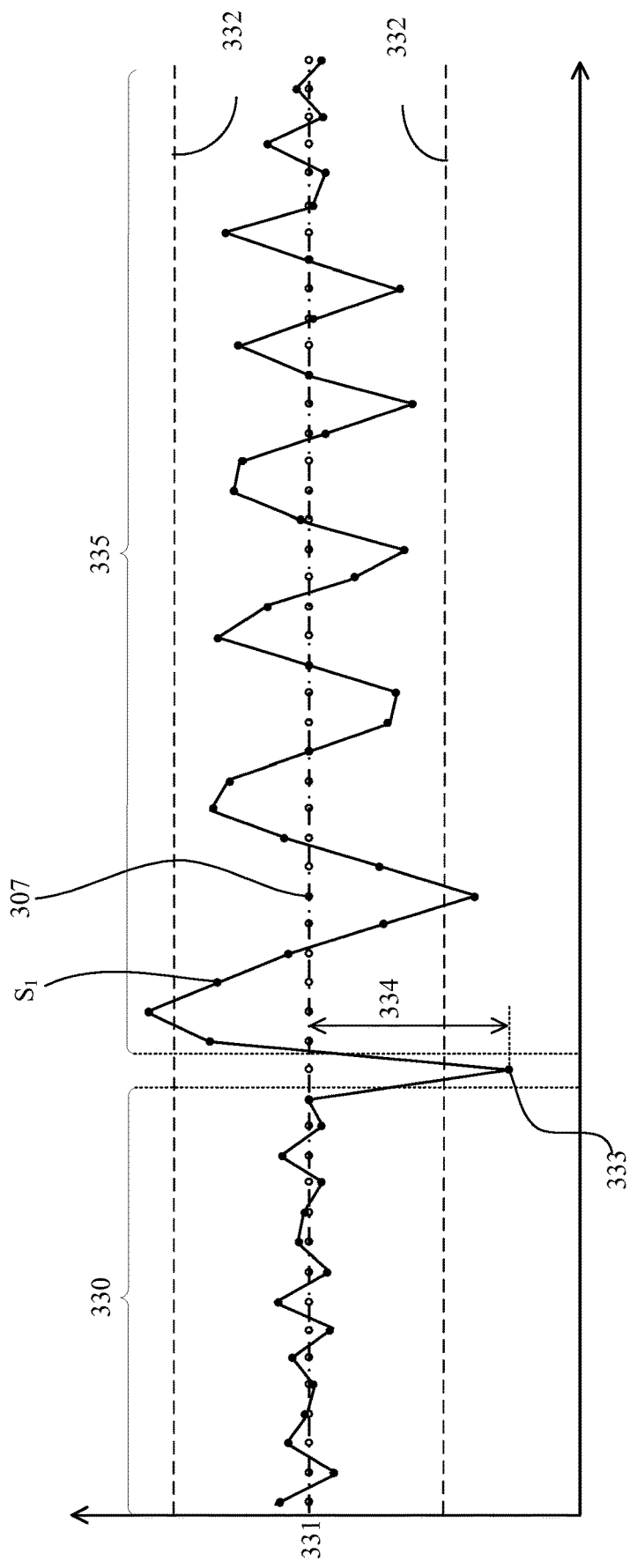
FIG. 5B shows the reference energy signal (dot-dashed line) and the signal (solid line) indicative of the energy of each pulse of radiation as a function of time during a time period in which the radiation source produces a drop out pulse for a method with a single operation mode.

FIG. 5B shows an example reference energy signal 307 (open circles and dot-dashed line) and example signal $S_1$ (closed circles and solid line) indicative of the energy of each pulse of radiation as determined by a radiation sensor RS as a function of time for an arrangement wherein there is no switching between two different operation modes. Note that the scale of FIG. 5B is different to that of FIG. 5A.

The reference energy signal 307 is substantially constant at an energy of 331 for the entire time period shown. For a first time period 330, the signal $S_1$ indicative of the energy of the pulses of radiation oscillates about the energy 331 with time under the influence of the feedback box 303. During the first time period 330 variations in pulse energy are relatively small such that the magnitude of the difference between the monitored energy $S_1$ and the reference energy signal 307 is less than a threshold value, as indicated by dashed lines 332. In this example, the threshold value is 50% of the reference energy signal 307 although it will be appreciated that other threshold values may alternatively be used.

Following the first time period 330, the radiation source SO produces a drop out pulse 333, which deviates significantly from the desired energy (i.e. the reference energy signal 307). The magnitude of the difference 334 between the monitored energy $S_1$ of the drop out pulse 333 and the reference energy signal 307 exceeds the threshold value. In this example, the energy of the drop out pulse is approximately 20% of the reference energy signal 307.

In response to the drop out pulse 333, the signal 302 sent to the feedback box 303 is equal to the drop out error 334. The feedback box 303 reacts aggressively in an attempt to compensate for the drop out pulse 333. However, since the drop out error 334 is large (in this example around 80% of the reference energy signal 307) the aggressive response from the feedback box 303 results in desired values for one or more input parameters of the radiation source SO (for example the high voltage across a pair of conductors) that lie outside of the operational range of the radiation source SO. As such, these values are limited by the limiter box 311. As a result, a second period 335 of undesired unstable behavior follows wherein the size of the fluctuations of the signal $S_1$ from the reference energy signal 307 is significantly larger than during the first period 330. The size of these fluctuations decreases during the second time period 335. However, the time taken for the fluctuations to decrease is sufficiently large that it may result in an increase in dose error during this second time period 335. This is particularly the case if the duration of unstable behavior during the second time period 335 is comparable to, or greater than, a typical exposure time for a point on the substrate W.

In the above example (FIG. 5A), a constant energy reference adjustment profile was used to mitigate the total dose error of the dropout pulse. However, to optimize the gain in dose performance, different energy reference adjustment profiles can be used.

Figure 6A:
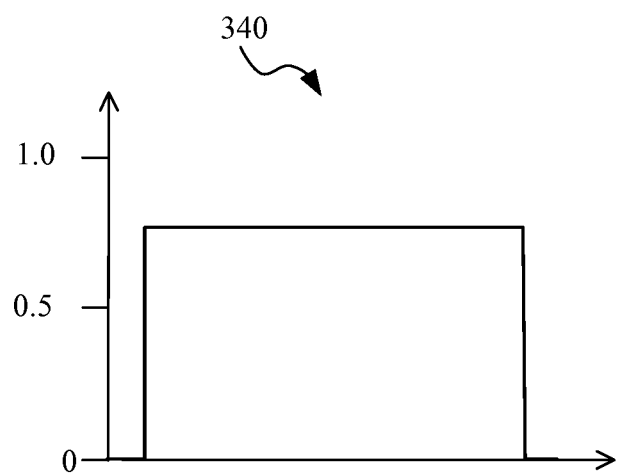
FIG. 6A shows a constant reference energy adjustment profile that may be used by some embodiments.
Figure 6B:
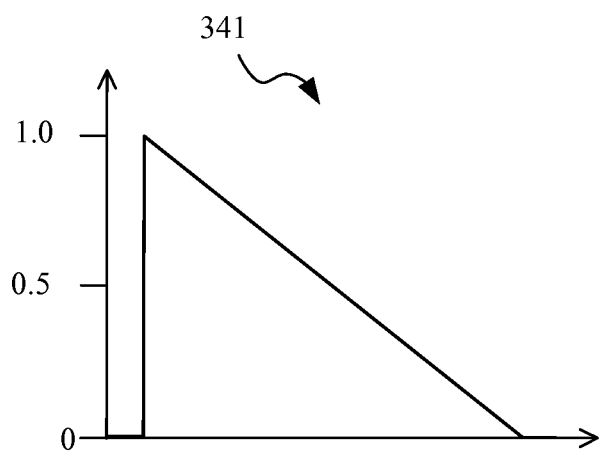
FIG. 6B shows a linear reference energy adjustment profile that may be used by some embodiments.
Figure 6C:
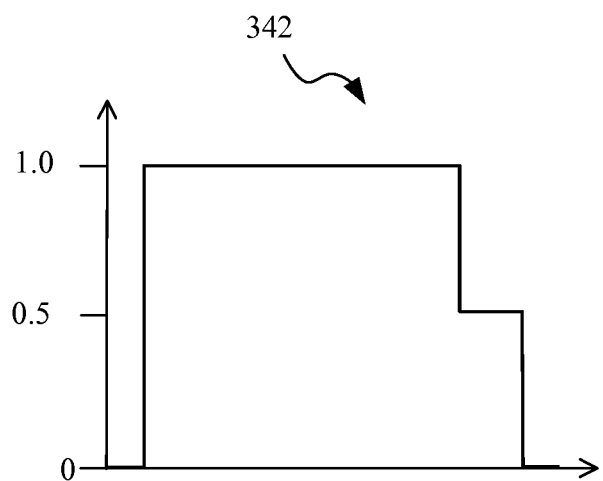
FIG. 6C shows a maximized constant reference energy adjustment profile that may be used by some embodiments.

Three non-limiting examples of reference energy adjustment profiles as a function of time that may be used are shown in FIGS. 6A, 6B and 6C.

The profile 340 shown in FIG. 6A is a constant profile, as described above, wherein the dropout error is divided equally over a predefined number of pulses. An advantage of such a constant profile is that the risk of generating a value of one or more parameters of the radiation source SO that lies outside of the allowed performance range of the radiation source SO can be minimized (by appropriate choice of the predefined number of pulses over which the drop out error is divided). However, the constant profile may not be optimal for dose performance (i.e. for minimizing dose variation).

The profile 341 shown in FIG. 6B may be referred to as a linear profile, wherein the fraction of the drop out pulse error that is added to the reference energy signal 307 decreases linearly with time during operation in the second mode. With such a linear profile, the drop out pulse error can be mitigated more quickly. An advantage of the linear profile is that the reference energy signal 307 goes gradually back to the nominal reference energy signal (i.e. the value of the reference energy signal 307 during the first mode of operation). However, in order to compensate for the same drop out pulse error using the linear profile in the same time period (or, equivalently, the same number of subsequent pulses) when using the linear profile the first subsequent pulse must be higher than that when using a constant profile. This increases the risk of generating a value of one or more parameters of the radiation source SO that lies outside of the allowed performance range of the radiation source SO.

The profile 342 shown in FIG. 6C may be referred to as a maximized constant profile. For the maximized constant profile, the reference energy signal 307 is increased to a maximum value for each subsequent pulse after the drop out pulse except for the last subsequent pulse. The reference energy signal 307 for the last subsequent pulse is increased by a sufficient amount (in general less than the maximum value) to ensure that the drop out pulse error is corrected for. That is, reference energy signal 307 for the last subsequent pulse is increased by a sufficient amount such that the sum of increases in reference energy signal for all of the subsequent pulses is equal to the drop out pulse error. For example, for a drop out pulse error of 9 arbitrary units and a maximum value of 2 arbitrary units, the maximized constant profile may be such that the reference energy signal 307 is increased by 2 arbitrary units for four subsequent pulses and by 1 arbitrary unit for a fifth subsequent pulse.

For the maximized constant profile, the maximum value of the reference energy signal 307 may correspond to a maximum value of the one or more parameters of the radiation source SO that lies within the allowed performance range of the radiation source SO. In practice, the maximum value of the reference energy signal 307 is chosen to be smaller than the value that corresponds to an actual maximum value of the one or more parameters that lies within the allowed performance range to allow the energy of the subsequent pulses to oscillate about the maximum value without risking generation of a value of the one or more parameters that lies outside of the allowed performance range.

The above described maximized constant profile 342 allows for the drop out pulse error to be compensated for more quickly than with the constant profile 340 although the risk of generating a value of one or more parameters of the radiation source SO that lies outside of the allowed performance range of the radiation source SO is increased.

With the described method, in the event of a drop out pulse the stability of the control loop is increased, while maintaining a high performance in the nominal situation (i.e. allowing an aggressive feedback response in the first mode). As a result, dose errors (i.e. variation in doses of radiation delivered to different points on the substrate W) will be reduced significantly. This is clear from FIGS. 5A and 5B since the duration of unstable behavior following a drop out pulse is significantly shorter when using the above described method (see FIG. 5A) than when using a method wherein there is no switching between two different operation modes (see FIG. 5B). In particular, when using the above described method the duration of unstable behavior following a drop out pulse is significantly shorter than a typical exposure time for a point on the substrate W. As a result, dose errors remain low. Depending on system parameters (such as the slit profile and scan speed) in some embodiments, the dose error caused by drop out pulses is expected to be reduced by a factor 4 or more by using the above described method.

Although the above examples of the new method have primarily described the compensation for drop out pulses, alternatively or in addition, the new method may be used to correct for pulses with an energy that is significantly larger than the desired energy level. Such a scenario, wherein a pulse has an energy that is too high may be referred to as a drop in pulse.

A frequency of drop out pulses produced by a laser typically increases strongly with the age of the laser chamber. By mitigating the effect of drop out pulses more effectively, the above method can therefore extend the useable lifetime of the laser chamber. In turn, this can: (a) prevent downtime due to laser maintenance; and/or (b) reduce laser maintenance costs.

The above described method comprises periodically monitoring an output energy of the radiation source. For the pulsed radiation source of the above embodiment, this is achieved by monitoring an energy of each pulse or a set of pulses of the radiation source. It will be appreciated that the method may equivalently comprise periodically monitoring an output power of the radiation source.

Although the above described embodiment relates to a pulsed radiation source, it will be appreciated that alternative embodiments may relate to continuous radiation sources.

The power of a radiation beam is the rate at which it supplies energy. Power has units of energy per unit time (for example W). The irradiance of a radiation beam incident upon a surface is the power of the radiation beam per unit area that is incident upon that surface. Irradiance has units of energy per unit time per unit area (for example $Wm^{-2}$). In the above disclosure, the terms "power" and "irradiance" may be used interchangeably, the meaning being clear from the context of the use.

In the above disclosure, the amount of energy per unit area which is received by a substrate W may be referred to interchangeably as the "dose of radiation", the "dose of energy", the "energy dose" or the "dose".

While the radiation source SO has been described as comprising a laser, the radiation source SO may be any form of radiation source SO. For example the radiation source SO may be an EUV radiation source (e.g. a discharge produced plasma source, a laser produced plasma source and/or a free electron laser) and/or a lamp type light source (e.g. a mercury discharge lamp).

Although an embodiment of the invention has been described above in the context of a DUV lithographic apparatus employing transmissive optics, it is also applicable to EUV lithographic apparatuses using reflective optics.

While specific embodiments of the invention have been described above, it will be appreciated that the invention may be practiced otherwise than as described. The description is not intended to limit the invention.

The invention claimed is:

1. A method of controlling an output of a radiation source, the method comprising:
   periodically monitoring an output energy of the radiation source;
   determining a difference between a reference energy signal and the monitored output energy of the radiation source;
   determining a feedback value, the feedback value being dependent on the determined difference between the reference energy signal and the monitored output energy for a preceding time period;
   determining a desired output energy of the radiation source for a subsequent time period, the desired output energy being a combination of the reference energy signal and the feedback value;
   controlling an input parameter of the radiation source in dependence on the determined desired output energy during the subsequent time period;
   spreading a certain determined difference between the monitored output energy of the radiation source and the reference energy signal over a particular subsequent time period according to a reference energy signal adjustment profile; and
   for that particular subsequent time period during which the determined difference between the monitored output energy of the radiation source and the reference energy signal does not contribute to the feedback value, altering the reference energy signal for the subsequent time period such that the reference energy signal adjustment profile is added to or subtracted from the reference energy signal for the subsequent time period.

2. The method of claim 1, wherein the length of the subsequent time period over which the determined difference between the monitored output energy of the radiation source and the reference energy signal is added to or subtracted from the reference energy is dependent on the magnitude of the determined difference between the monitored output energy of the radiation source and the reference energy signal.

3. The method of claim 1, wherein a shape of the reference energy signal adjustment profile is dependent on the magnitude of the determined difference between the monitored output energy of the radiation source and the reference energy signal.

4. The method of claim 1, wherein the reference energy signal adjustment profile is a constant profile such that the determined difference between the monitored output energy of the radiation source and the reference energy signal is spread evenly over the subsequent time period.

5. The method of claim 1, wherein the reference energy signal adjustment profile is a linear profile such that a fraction of the determined difference between the monitored output energy of the radiation source and the reference energy signal that is added to or subtracted from the reference energy signal decreases linearly with time during the subsequent time period.

6. The method of claim 1, wherein the reference energy signal adjustment profile is a maximized constant profile wherein the reference energy signal is increased to a maximum value for a first portion of the subsequent time period and decreases to a smaller value for a second portion of the subsequent time period.

7. The method of claim 1, comprising evaluating the magnitude of the determined difference between the monitored output energy of the radiation source and the reference energy signal against a threshold value, wherein the threshold value is chosen such that the magnitude of the determined difference between the monitored output energy of the radiation source and the reference energy signal exceeds the threshold value responsive to the determined difference between the monitored output energy of the radiation source and the reference energy signal giving rise to a value of the input parameter of the radiation source outside of its operational range.

8. The method of claim 1, comprising evaluating the magnitude of the determined difference between the monitored output energy of the radiation source and the reference energy signal against a threshold value, wherein the threshold value is chosen such that the magnitude of the determined difference between the monitored output energy of the radiation source and the reference energy signal will not exceed the threshold value responsive to the determined difference between the monitored output energy of the radiation source and the reference energy signal being less than a typical amplitude of noise on a signal indicative of the monitored output energy of the radiation source.

9. The method of claim 1, comprising evaluating the magnitude of the determined difference between the monitored output energy of the radiation source and the reference energy signal against a threshold value, wherein the threshold value is equal to or more than 25% of the reference energy.

10. The method of claim 1, wherein the feedback value is determined such that the desired output energy for the subsequent time period at least partially compensates for a difference between the reference energy and the monitored output energy over the preceding time period.

11. The method of claim 1, wherein controlling the input parameter of the radiation source in dependence on the determined desired output energy during the subsequent time period comprises:
calculating a value for the input parameter of the radiation source using a relationship, and
controlling the radiation source using the calculated input parameter.

12. The method of claim 1, wherein the radiation source is a gas laser comprising a pair of discharge conductors across which a voltage is applied and the input parameter of the radiation source comprises the voltage applied across the pair of discharge conductors.

13. The method of claim 1, wherein controlling the input parameter of the radiation source in dependence on the determined desired energy during the subsequent time period further comprises limiting the one or more parameters to an allowed operational range.

14. A lithography method comprising:
providing a radiation beam using a radiation source;
using a patterning device to impart the radiation beam with a pattern in its cross-section; and
projecting the patterned radiation beam onto a target portion of a substrate;
wherein an output power of the radiation source is controlled using the method of claim 1.

15. The lithography method of claim 14, wherein the power of the radiation beam is controlled so as to ensure that one or more parts of the target portion receive a desired dose of radiation.

16. A method of controlling an output of a radiation source, the method comprising:
periodically monitoring an energy of the radiation source;
determining a difference between a reference energy signal and the monitored energy of the radiation source;
determining a desired energy of the radiation source for a subsequent time period, wherein the determination of the desired energy is dependent on the magnitude of the determined difference between the monitored energy of the radiation source and the reference energy signal; and
controlling an input parameter of the radiation source in dependence on the determined desired energy during the subsequent time period,
wherein, for a period of time, the determined difference between the monitored energy of the radiation source and the reference energy signal does not cross a threshold value and the determination of the desired energy is according to a first operational mode, which first operational mode involves control of the input parameter based on the determined desired energy, and
wherein, for another period of time, the determined difference between the monitored energy of the radiation source and the reference energy signal crosses the threshold value and the determination of the desired energy is according to a second operational mode, which second operational mode involves altering the reference energy signal.

17. A control system for a radiation source, the control system comprising:
a radiation sensor operable to periodically determine an energy of the radiation source; and a controller configured to at least:
 determine a difference between a reference energy signal and the determined energy of the radiation source;
 determine a feedback value, the feedback value being dependent on the determined difference between the reference energy signal and the determined energy for a preceding time period;
 determine a desired energy of the radiation source for a subsequent time period, the desired energy being a sum of the reference energy signal and the feedback value;
 determine a value of an input parameter of the radiation source in dependence on the determined desired energy during the subsequent time period;
 spread a certain determined difference between the monitored output energy of the radiation source and the reference energy signal over a particular subsequent time period according to a reference energy signal adjustment profile; and
 for that particular subsequent time period during which the determined difference between the monitored output energy of the radiation source and the reference energy signal does not contribute to the feedback value, alter the reference energy signal for the subsequent time period such that the reference energy signal adjustment profile is added to or subtracted from the reference energy signal for the subsequent time period.

18. A lithographic system comprising:
a radiation source operable to output a radiation beam;
an illumination system configured to condition the radiation beam;
a substrate table configured to hold a substrate such that a target portion of the substrate is arranged to receive the radiation beam;
a projection system configured to project the radiation beam onto the substrate; and
the control system of claim 17.

19. A non-transitory computer-readable medium comprising program instructions that, upon execution by a computer system, are configured to cause the computer system to at least:
 determine a difference between a reference energy signal and a periodically monitored output energy of a radiation source;
 determine a feedback value, the feedback value being dependent on the determined difference between the reference energy signal and the monitored output energy for a preceding time period;
 determine a desired output energy of the radiation source for a subsequent time period, the desired output energy being a combination of the reference energy signal and the feedback value;
 control an input parameter of the radiation source in dependence on the determined desired output energy during the subsequent time period;
 spread a certain determined difference between the monitored output energy of the radiation source and the reference energy signal over a particular subsequent time period according to a reference energy signal adjustment profile; and
 for that particular subsequent time period during which the determined difference between the monitored output energy of the radiation source and the reference energy signal does not contribute to the feedback value, alter the reference energy signal for the subsequent time period such that the reference energy signal adjustment profile is added to or subtracted from the reference energy signal for the subsequent time period.

20. A non-transitory computer-readable medium comprising program instructions that, upon execution by a computer system, are configured to cause the computer system to at least:
 determine a difference between a reference energy signal and a monitored energy of a radiation source;
 determine a desired energy of the radiation source for a subsequent time period, wherein the determination of the desired energy is dependent on the magnitude of the determined difference between the monitored energy of the radiation source and the reference energy signal; and
 control an input parameter of the radiation source in dependence on the determined desired energy during the subsequent time period, such that, for a period of time for which is determined that the determined difference between the monitored energy of the radiation source and the reference energy signal does not cross a threshold value, the determination of the desired energy is according to a first operational mode, which first operational mode involves control of the input parameter based on the determined desired energy, and such that, for another period of time for which it is determined that the difference between the monitored energy of the radiation source and the reference energy signal crosses the threshold value, the determination of the desired energy is according to a second operational mode, which second operational mode involves altering the reference energy signal.

* * * * *